United States Patent
Purdy et al.

(10) Patent No.: US 10,443,124 B1
(45) Date of Patent: Oct. 15, 2019

(54) PROCESS AND APPARATUS FOR MAKING COMPOSITE STRUCTURES

(75) Inventors: Mark James Purdy, Akron, OH (US); John Edgar Finley, Liberty Lake, WA (US); Mark Russell Wolke, Spokane, WA (US); James Warren Rudolph, Colorado Springs, CO (US); Timothy Patrick Smith, Akron, OH (US)

(73) Assignee: GOODRICH CORPORATION, Charlotte, NC (US)

(*) Notice: Subject to any disclaimer, the term of this patent is extended or adjusted under 35 U.S.C. 154(b) by 0 days.

(21) Appl. No.: 12/878,764

(22) Filed: Sep. 9, 2010

(51) Int. Cl.
| C04B 35/00 | (2006.01) |
| C23C 16/04 | (2006.01) |
| C23C 16/22 | (2006.01) |
| C04B 35/83 | (2006.01) |

(52) U.S. Cl.
CPC ............ *C23C 16/045* (2013.01); *C04B 35/83* (2013.01); *C23C 16/22* (2013.01)

(58) Field of Classification Search
None
See application file for complete search history.

(56) References Cited

U.S. PATENT DOCUMENTS

| 5,217,755 A * | 6/1993 | Thebault et al. ......... 427/249.2 |
| 5,389,450 A * | 2/1995 | Kennedy ................. B32B 18/00 |
| | | 252/389.31 |
| 5,869,411 A * | 2/1999 | Bazshushtari et al. ....... 442/340 |
| 2001/0019752 A1* | 9/2001 | Purdy et al. ................. 428/64.1 |
| 2007/0172639 A1* | 7/2007 | Kmetz ..................... B32B 18/00 |
| | | 428/311.11 |
| 2009/0053413 A1* | 2/2009 | Chang et al. ............... 427/248.1 |
| 2009/0110877 A1* | 4/2009 | Bernard et al. ............... 428/131 |

OTHER PUBLICATIONS

Wikipedia—Natural Gas definiion, downloaded Aug, 2012.*

* cited by examiner

*Primary Examiner* — Joseph A Miller, Jr.
(74) *Attorney, Agent, or Firm* — Snell & Wilmer, L.L.P.

(57) ABSTRACT

A process and an apparatus for densifying a porous structure is disclosed. The porous structure comprises a first surface, a second surface, an inner diameter surface and an outer diameter surface. The process may comprise progressive densification in conjunction with thermal gradient and/or pressure gradient densification processes.

20 Claims, 17 Drawing Sheets

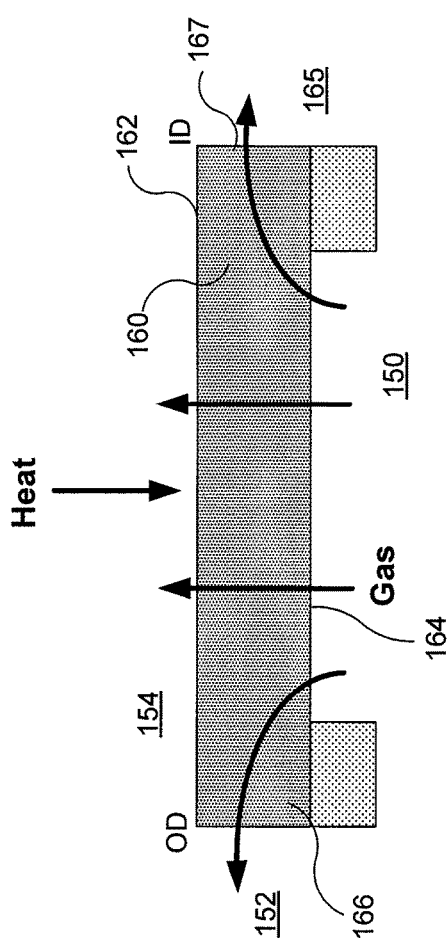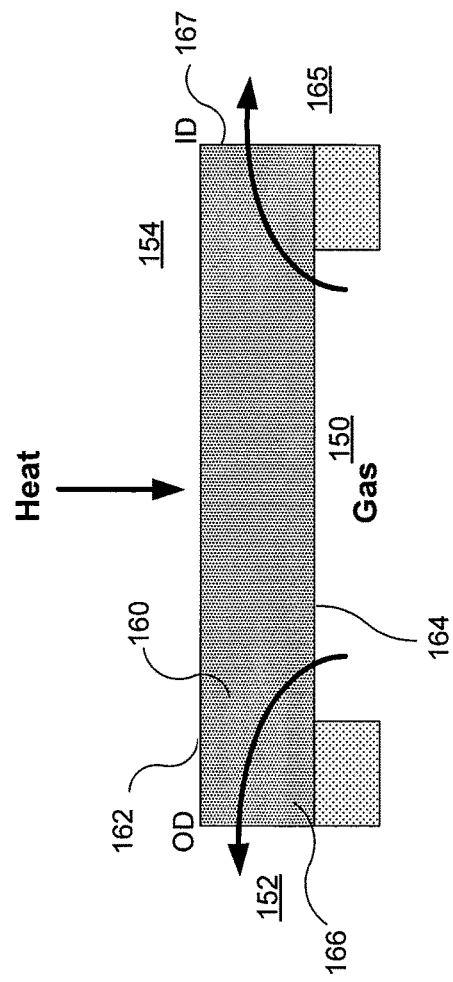

PROCESS AND APPARATUS FOR MAKING COMPOSITE STRUCTURES

BACKGROUND

Chemical vapor infiltration and deposition (CVI/CVD) is a known process for making composite structures such as carbon/carbon brake disks. The CVI/CVD process typically used for making carbon/carbon brake disks is sometimes referred to as "conventional" or "isothermal" CVI/CVD. This process involves passing a reactant gas or gas mixture (e.g., methane, propane, etc.) around heated porous structures (e.g., carbonized preforms) at absolute pressures as low as a few millitorr. The gas diffuses into the porous structures, driven by concentration gradients, and undergoes a CVD reaction such as thermal decomposition, hydrogen reduction, co-reduction, oxidation, carbidization, or nitridation to deposit a binding matrix.

Depending on CVI/CVD methodology and conditions, the porous structure may not densify at a uniform rate across the thickness of a porous structure. Thus, creation of uniformly densified porous structures may be impaired. Thus, systems and methods for improved densification efficacy and/or efficiency are desirable.

SUMMARY

In various embodiments, a process for densification is provided comprising coupling a first porous structure having a first surface and a second surface with a second porous structure having a first surface and a second surface so that the second surface of the first porous structure is in contact with the first surface of the second porous structure, establishing a thermal gradient in a process furnace, the temperature of the first surface of the first porous structure being higher than the temperature of the second surface of the second porous structure, flowing gas through the second surface of the second porous structure, to form a solid residue within at least one of the first porous structure and the second porous structure, decoupling the first porous structure and the second porous structure, coupling the second porous structure with a third porous structure having a first surface and a second surface so that the second surface of the second porous structure is in contact with the first surface of the third porous structure, and flowing gas through the second surface of the third porous structure, forming a solid residue within at least one of the second porous structure and the third porous structure.

In further embodiments, a process is provided comprising coupling a first porous structure having a first surface and a second surface with a second porous structure having a first surface and a second surface so that the second surface of the first porous structure is in contact with the first surface of the second porous structure, establishing a thermal gradient in a process furnace, the temperature of the first surface of the first porous structure being higher than the temperature of the second surface of the second porous structure, flowing gas through the first surface of the first porous structure, to form a solid residue within at least one of the first porous structure and the second porous structure, decoupling the first porous structure and the second porous structure, coupling the second porous structure with a third porous structure having a first surface and a second surface so that the second surface of the second porous structure is in contact with the first surface of the third porous structure, and flowing gas through the first surface of the second porous structure, forming a solid residue within at least one of the second porous structure and the third porous structure.

In still further embodiments, a process is provided comprising establishing a thermal gradient in a process furnace containing a porous structure having a first surface and a second surface, the temperature of the first surface of the porous structure being higher than the temperature of the second surface of the porous structure, flowing gas through the second surface of the porous structure to form a solid residue within the porous structure, cutting the porous structure to form a first porous structure remnant and a second porous structure remnant, the first porous structure remnant having a thickness less than the porous structure, coupling the second porous structure remnant with a second porous structure having a first surface and a second surface, so that the second surface of the second porous structure remnant is in contact with the first surface of the second porous structure; and flowing gas through the second surface of the second porous structure, forming a solid residue within at least one of the second porous structure remnant and the second porous structure.

In various embodiments, a process is provided comprising coupling a first porous structure system having a first surface and a second surface with a second porous structure system having a first surface and a second surface so that the second surface of the first porous structure system is in substantial contact with the first surface of the second porous structure system, establishing a thermal gradient in a process furnace, the temperature of the first surface of the first porous structure system being higher than the temperature of the second surface of the second porous structure system, flowing gas through the second surface of the second porous structure system, to form a solid residue within at least one of the first porous structure system and the second porous structure system, separating at least one of the first porous structure system and the second porous structure system to yield a first porous subsystem, coupling the first porous subsystem with a third porous structure system having a first surface and a second surface so that the second surface of the first porous subsystem is in substantial contact with the first surface of the third porous structure system, and flowing gas through the second surface of the third porous system, to form a solid residue within at least one of the first porous subsystem and the third porous structure system.

BRIEF DESCRIPTION OF THE DRAWINGS

FIGS. 7 and 8 are schematic illustrations showing the flow of gas through a porous structure during stages of the inventive densification process to make a composite structure;

DETAILED DESCRIPTION

Figure 1:
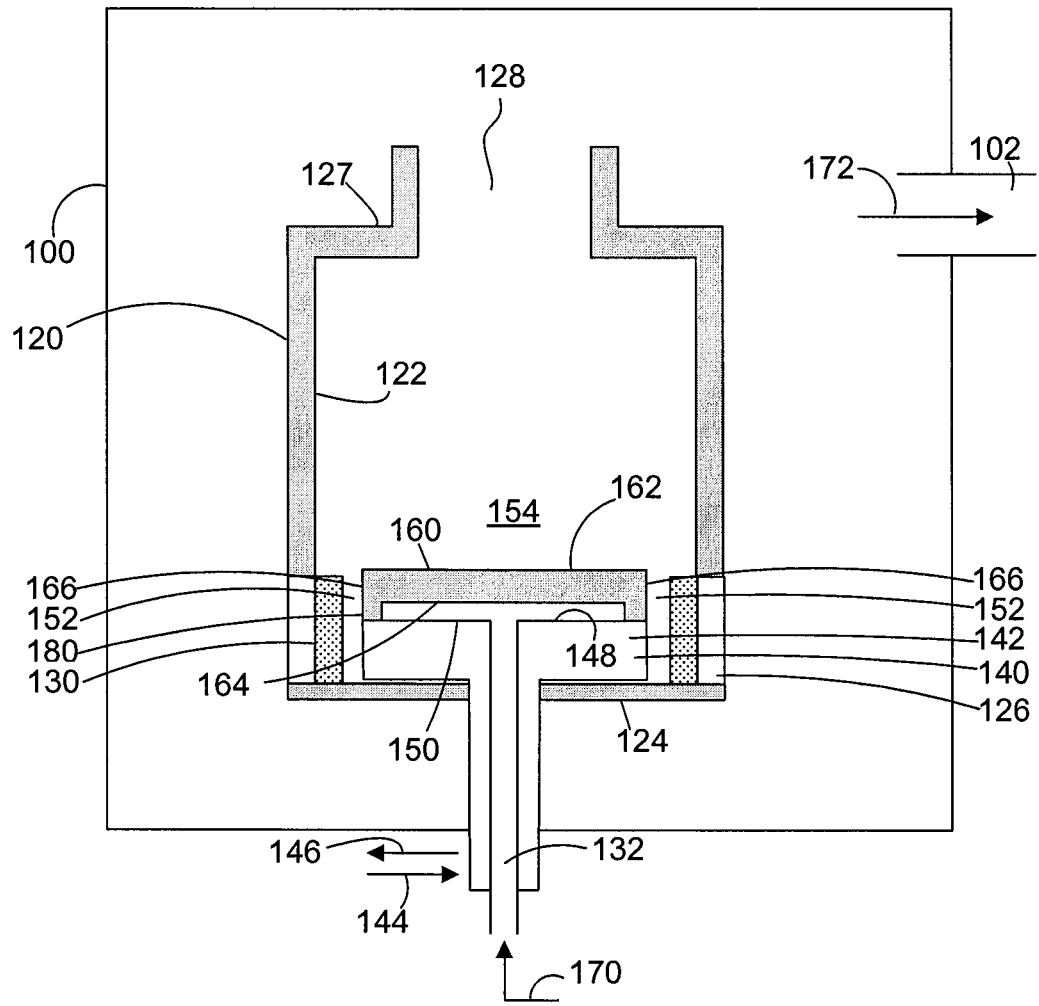
FIG. 1 is a schematic illustration of an apparatus for conducting a densification process pursuant to various embodiments.

All ranges and ratio limits disclosed herein may be combined. It is to be understood that unless specifically stated otherwise, references to "a," "an," and/or "the" may include one or more than one and that reference to an item in the singular may also include the item in the plural.

The detailed description of exemplary embodiments herein makes reference to the accompanying drawings, which show exemplary embodiments by way of illustration and its best mode, and not of limitation. While these exemplary embodiments are described in sufficient detail to enable those skilled in the art to practice the invention, it should be understood that other embodiments may be realized and that logical, chemical and mechanical changes may be made without departing from the spirit and scope of the invention. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

As described in detail herein, the densification of a porous structure may be accomplished using a thermal gradient process, a pressure gradient process, or a combination thereof. FIGS. 1-13 illustrate various thermal gradient/pressure gradient densification processes that are suitable for use with various embodiments. Progressive densification processes and, in particular, progressive thermal gradient/pressure gradient densification processes may be useful in efficient densification of a porous structure. FIGS. 14-19 illustrate various aspects and embodiments of progressive densification processes.

In accordance with various aspects of the densification processes described herein (e.g., thermal gradient and/or pressure gradient), densification occurs within a porous structure across a densification front. The densification front may be considered as a band within a porous structure that progresses through the thickness of a porous structure and at which point densification of the porous structure occurs at an increased rate, though densification may also occur to some extent outside the densification front. As the densification front completes its migration through the thickness of a porous structure, there is additional densification that occurs outside the band. In thermal gradient/pressure gradient processes using a single porous structure, the densification front may densify a portion of the porous structure, but a second portion of the porous structure may not be densified to a desired degree. This less dense portion requires additional densification or undesirable machining of the low density material, and thus the porous structure has a non-uniform or less uniform density.

Progressive densification processes, as described herein, prevent such "waste" densification by, in various embodiments, using the "waste" densification portions as a "primer" for further densification. Progressive densification processes, as described herein, may comprise one or more stages of densification coupled with progressively altering or adjusting the relative position of one or more porous structures or the separation of one porous structure into multiple porous structures in between densification cycles (also referred to as a densification "stages" and a collection of densification cycles comprising a densification process). In further embodiments, progressive densification processes may comprise one or more stages of densification coupled with progressively altering or adjusting the relative position of one or more porous structure systems, wherein a porous structure system may comprise one or more porous structures, also referred to as a porous structure system or porous structure subsystem.

In various embodiments, progressive densification processes may allow a first region of a porous structure (or porous structure system) to densify to a first density while a second region of the porous structure (or porous structure system) densifies to a second density. Then, the first region may be separated from the second region. The porous structure (or porous structure system) embodying the second region may coupled with a third porous structure (or porous structure system) to undergo additional densification. In various embodiments, the porous structure (or porous structure system) embodying the second region may be placed above the third porous structure (or porous structure system). The process may be repeated with additional porous structures (or porous structure systems).

The term "composite structure" may refer to a densified porous structure. The composite structure may comprise a porous structure with a solid residue or matrix dispersed throughout the porous structure. The composite structure may comprise a carbonaceous porous structure with a carbonaceous matrix dispersed in the porous structure. This may be referred to as a carbon/carbon composite. The composite structure may comprise a ceramic porous structure with a ceramic or oxide matrix dispersed in the porous structure. The composite structure may comprise a mixed or hybrid composite structure such as a carbon porous structure with a ceramic or oxide matrix dispersed in the porous structure, a carbon porous structure with a mix of carbon and ceramic or oxide matrix dispersed in the porous structure, a ceramic porous structure with a carbon matrix dispersed in the porous structure, a ceramic porous structure with a mix of carbon and ceramic or oxide matrix dispersed in the porous structure, and the like.

The terms "substantially rough laminar microstructure" and "substantially smooth laminar microstructure" may be used to describe the microstructure of a composite structure employing a carbon matrix dispersed in a porous structure. The microstructure may be determined by use of polarized light microscopy. A carbon/carbon composite with a rough laminar structure may be characterized as having high optical activity and numerous irregular extinction crosses. A carbon/carbon composite with a smooth laminar structure may be characterized as having low optical activity and smooth extinction crosses. These microstructures may be quantified in terms of their extinction angles wherein a smooth laminar structure has an extinction angle in the range from 10 to 16° while a rough laminar structure has an extinction angle greater than about 16°.

The term "thermal contact" may refer to two bodies, for example, a heating source and the surface of a porous structure or a cooling source and the surface of a porous structure, that may or may not be in physical contact with each other or adjacent to each other but still exchange heat with each other, such as by conduction, convection, and radiation. One body in thermal contact with another body may heat or cool the other body. In various embodiments, heat may be transferred by direct contact (i.e., conduction), by convection via gas flow, or by non-contact means, (i.e., radiation), which may be significant at high temperatures and with black-body types of materials.

The composite structures may be formed by infiltrating and depositing a matrix material in a porous structure. The infiltrating and depositing process may be referred to as a densification process. The composite structures may be useful as carbon/carbon aircraft disk brakes, ceramic combustion and turbine components such as turbine engine hot section components, ceramic friction materials, ceramic heat sinks, and the like. The carbon/carbon disk brakes may be in the form of circular disks or annular disks.

The porous structure may comprise at least one of carbon, silicon carbide, silicon nitride, boron carbide, aluminum nitride, titanium nitride, boron nitride, zirconia, $SiC_xN_y$, (wherein x is a number in the range from about zero to about 1, and y is a number in the range from about zero to about 4/3), silica, alumina, titania ($TiO_2$), and a combination of at least two of the foregoing. Prior to densification, the porous structure may be referred to as a preform. A preform for use in making a carbon/carbon composite, such as a carbon/carbon disk brake, may be referred to as a carbonized preform.

As used herein, the term "porous structure" may be interchangeable with "porous structure system." A porous structure system may comprise one or porous structures that are associated. For example, a porous structure system may comprise two porous structures coupled so that there is contact between each porous structure, such as in a "stack." A porous structure system may comprise three or four porous structures positioned so that at least two of the component porous structures are in contact with each other. For example, a porous structure system may comprise four porous structures positioned in a stack formation.

A porous structure may comprise any porous structure derived from a fibrous material such as carbon fibers, silicon carbide fibers, and the like. The carbon fibers may be derived from polyacrylonitrile, rayon (synthetic fiber derived from cellulose), pitch, and the like. The fibrous material may be in the form of a woven, braided or knitted fabric or a needled felt. The fibrous material may be in the form of chopped carbon fibers molded to form a preform. Prior to the densification process, the fibrous material may be formed into a preform having any desired shape or form.

The porous structure may be in the form of a disk having any shape such as, for example, a polygon, a cylinder, a triangle, square, rectangle, pentagon, hexagon, octagon, and the like. In addition, the porous structure may have an irregular form.

The porous structure may comprise a first surface, a second surface and at least one other surface connecting the first surface and the second surface. In various embodiments, and as used herein, any surface may be any shape such as, for example, at least one of rounded, sphere shaped, toroid shaped, or frustoconical.

The porous structure may be in the form of a disk having a first generally planar surface and a second generally planar surface. The second generally planar surface may be positioned opposite the first generally planar surface. The term "generally planar surface" is used herein to denote the fact that the planar surfaces are not absolutely flat surfaces inasmuch as the porous structure is porous and the planar surfaces have relatively rough surfaces as a result of the porous construction. However, in various embodiments, at least one surface of the porous structure is generally non-planar. For example, the porous structure may have a first generally planar surface and a second non-planar surface or a first non-planar surface and a second non-planar surface. The first and second generally planar surfaces may be bounded by the at least one other surface which may comprise at least one peripheral surface. The peripheral surface may comprise a circumferential surface. The porous structure may be in the form of a circular disk or an annular disk. When in the form of a circular disk, the first and second generally planar surfaces may be bounded by an outside peripheral surface. When in the form of an annular disk, the first and second generally planar surfaces may be bounded by an outside peripheral surface and an inside peripheral surface.

The porous structure may be heat treated prior to densification. The heat treating may be conducted in a vacuum or an inert atmosphere at a temperature in the range from about 1400 to about 2800° C., and in one embodiment in the range from about 1600 to about 2200° C., for a period of time in the range up to about 60 hours, and in one embodiment in the range up to about 10 hours. When the porous structure comprises carbon or is formed using carbon fibers or a carbon precursor, this heat treating step may be referred to as a carbonizing step, and the heat treated porous structure may be referred to as a carbonized preform.

The carbonized preforms may be in the form of circular or annular disks.

These preforms may be used to make carbon/carbon brake disks.

The pore size and pore volume of the porous structure (e.g., carbonized preform) should be sufficient to permit a gas to infiltrate the pores under reaction conditions and form a solid residue or matrix therein as a result of thermal decomposition.

The gas or feed gas may comprise any gas that upon thermal pyrolysis forms a desired solid residue in the pores of the porous structure. Stated another way, the gas or feed gas may comprise a precursor to a substance that forms desired solid residue in the pores of the porous structure. When carbon is the desired residue, as in the formation of carbon/carbon composites, the gas may comprise one or more hydrocarbons. The hydrocarbons may comprise alkanes, for example, straight chain, branched chain and/or cyclic alkanes, having from 1 to about 8 carbon atoms, and in one embodiment from 1 to about 6 carbon atoms, and in one embodiment from 1 to about 3 carbon atoms. Methane, ethane, propane, cyclopentane, or mixtures of two or more thereof may be used. The gas may comprise one or more alkenes of 2 to about 8 carbon atoms, and in one embodiment from 2 to about 6 carbon atoms. Mixtures of one or more alkanes of 1 to about 8 carbon atoms with one or more alkenes of 2 to about 8 carbon atoms may be used.

The gas may comprise one or more precursors of silicon carbide. An example of such a precursor may comprise methyltrichlorosilane, hydrogen and nitrogen. Another precursor may comprise dimethyldichlorosilane, silicon tetrahydride and a carbon source such as methane.

The gas may comprise one or more precursors of boron carbide ($B_4C$) or $Si_3N_4$. An example of a precursor of boron carbide may comprise a mixture of hydrogen, methane and boron trichloride.

These gases may be referred to as reactant gases. The gas may further comprise one or more diluent and/or inert gases, for example, hydrogen, nitrogen, helium, argon, or a mixture of two or more thereof. The volume to volume ratio of diluent and/or inert gas to reactant gas may be in the range from about 0:1 to about 50:1, and in one embodiment in the range from about 0.1:1 to about 50:1, and in one embodiment in the range from about 0.1:1 to about 30:1, and in one embodiment in the range from about 0.1:1 to about 15:1, and in one embodiment in the range from about 0.1:1 to about 10:1, and in one embodiment in the range from about 0.2:1 to about 10:1, and in one embodiment in the range from about 0.5:1 to about 5:1.

Pressure gradients may also be used with thermal gradients in various embodiments. A pressure gradient may be created when pressure on one surface of a porous structure is different that the pressure at another surface of the porous structure.

The apparatus and process for making the composite structures will now be discussed with reference to the drawings. Referring initially to FIGS. 1-9, the apparatus for conducting the densification process may comprise densification chamber 100 which contains densification unit 120. The densification chamber 100 may be in the form of a cylindrical pressure vessel. Densification unit 120 may be circular to conform to the shape of the densification chamber 100. Support structure 140 forms part of the densification unit 120, and porous structure 160 is mounted on support structure 140. Seal ring 180 is positioned between the support structure 140 and the porous structure 160. Seal ring 180 may be formed separately from the support structure 140 and then mounted on the support structure 140, or it may be formed integrally with the support structure 140.

Figure 2:
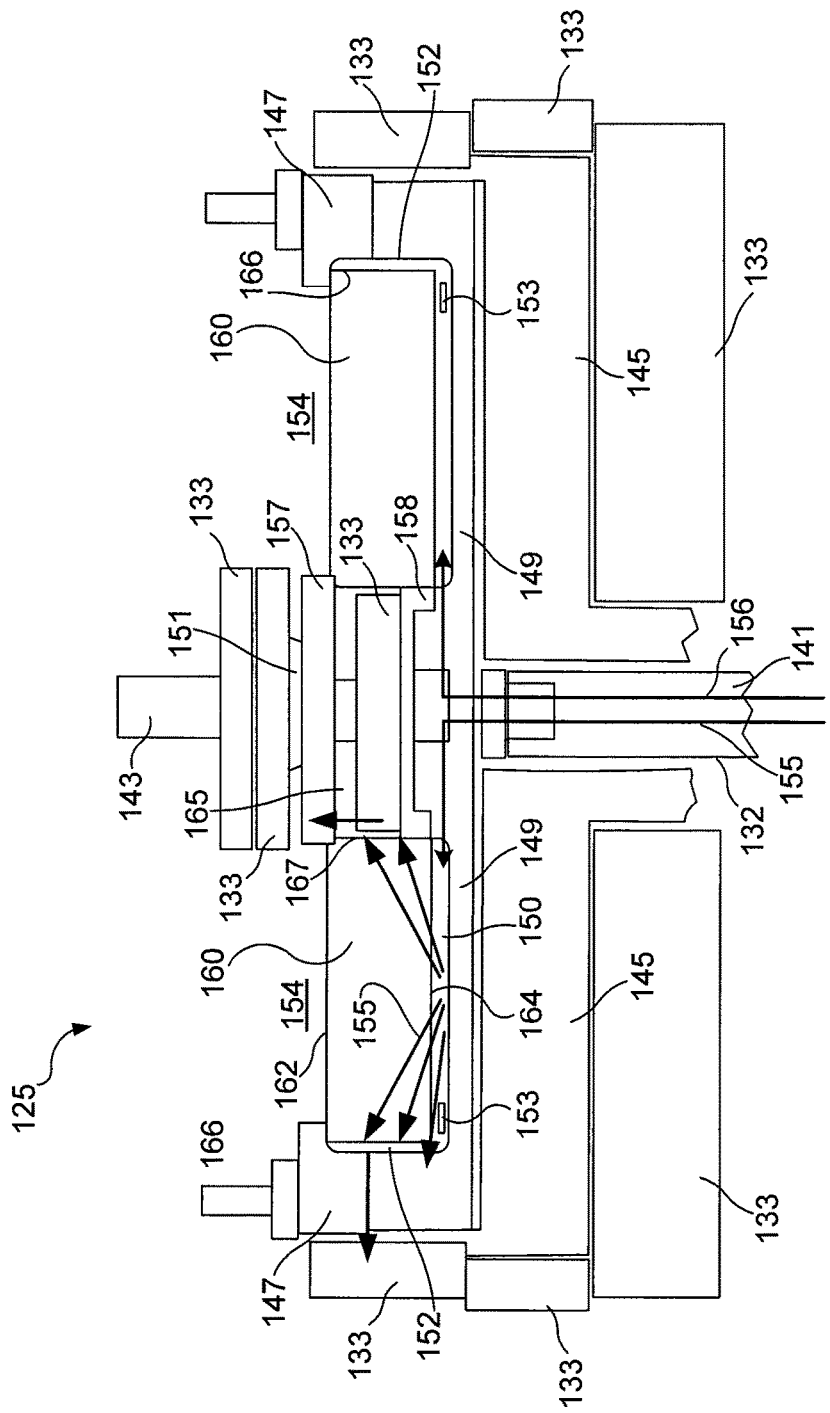
FIG. 2 is a schematic illustration of an apparatus similar to the apparatus illustrated in FIG. 1, with the exception that the apparatus illustrated in FIG. 2 is adapted for densifying a porous structure in the form of an annular disk.
Figure 3:
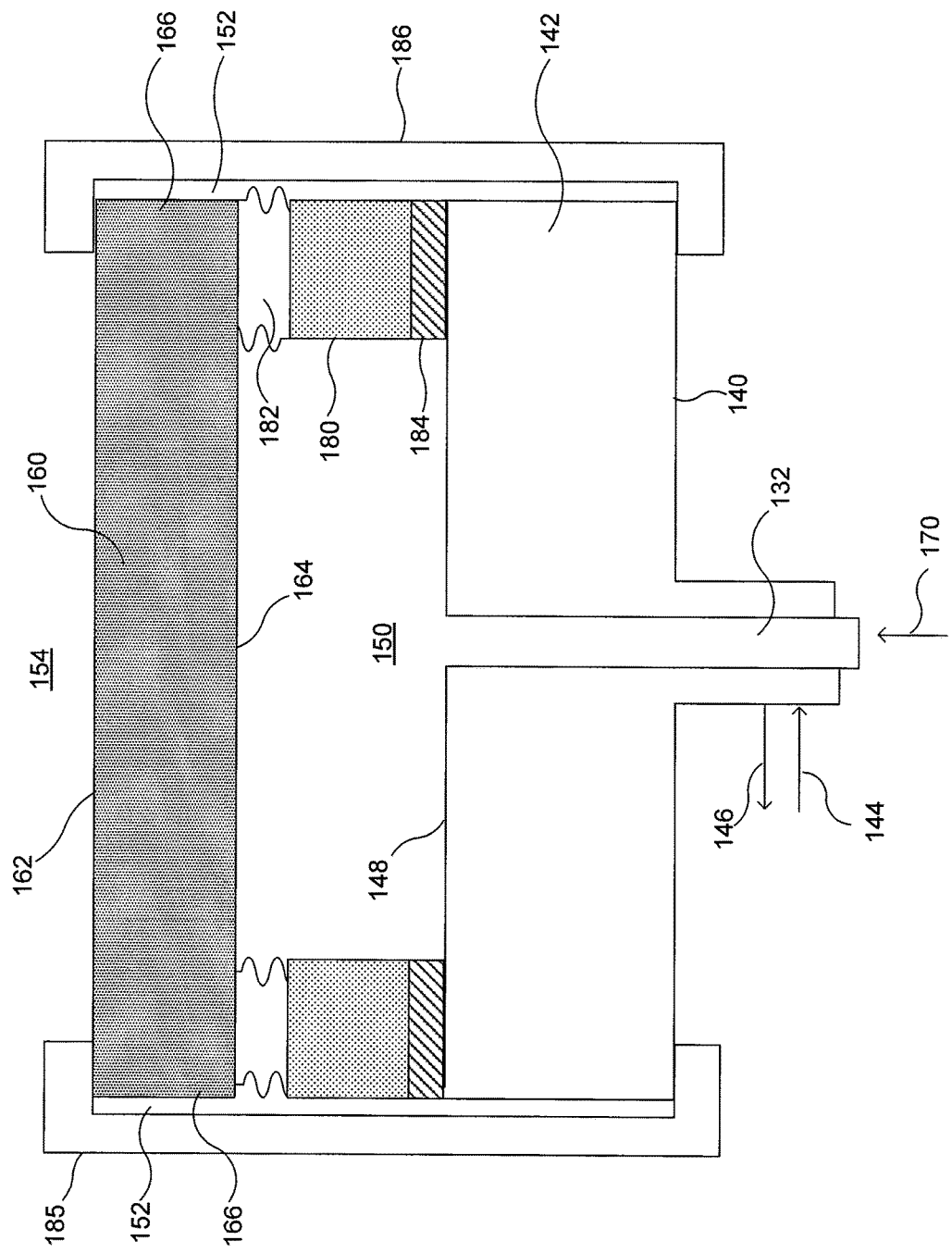
FIG. 3 is a schematic illustration of the porous structure, support structure and seal ring illustrated in FIG. 1.

The porous structure 160 has a first surface 162, which may be in the form of a first generally planar surface, and a second surface 164, which may be in the form of a second generally planar surface. The first and second surfaces are connected by at least one other surface. The porous structure 160 may be in the form of a circular disk or an annular disk. The circular disks have outside diameters (OD), while the annular disks have both outside diameters (OD) and inside diameters (ID). The at least one other surface may be in the form of peripheral surface 166 (circular disk) or peripheral surfaces 166 and 167 (annular disk). The porous structure 160 illustrated in FIGS. 1, 3, and 5 is in the form of a circular disk, and for these disks the at least one other surface is outside peripheral surface 166. Alternatively, the porous structure 160 may be in the form of an annular disk as illustrated in FIGS. 2, 4, 7, 8 and 9. The porous structure 160, when in the form of an annular disk, has a center opening 165, and the at least one other surface comprises outside peripheral surface 166 and inside peripheral surface 167.

The support structure 140 may comprise any support fixture assembly that does not interfere with the flow of gas through the first and second surfaces 162 and 164, and the at least one other surface (e.g., peripheral surfaces 166 and 167) of the porous structure 160. In one embodiment, with the possible exception of the perimeter or small areas in the perimeter of the surfaces 162 and/or 164 which may be in contact with clamps and/or other support fixture parts, the support structure 140 may not contact the surfaces 162 and 164 or the peripheral surfaces 166 and 167. Alternatively, the first surface 148 of the support structure 140 may comprise a perforated or porous material that is sufficiently porous to permit gas flow to and through the second surface 164 of the support structure 160 and, in this embodiment, the first surface 148 of the support structure 140 may contact the second surface 164 of the porous structure 160. The seal ring 180, which may be formed separately from or integrally with the support structure 140, may contact part of the second surface 164 of the porous structure 160.

The densification unit 120 includes cooling element 142 which is in thermal contact with second generally planar surface 164 of the porous structure 160 and is adapted for cooling the second surface 164. The cooling element 142 may comprise one or more cooling conduits or channels in the support structure 140. The cooling element 142 may use any suitable fluid coolant such as water, nitrogen, oil, and the like. The coolant may flow into and out of the cooling element 142 as indicated by arrows 144 and 146. Alternatively, the cooling element 142 may comprise one or more non-fluid cooling elements.

The densification unit 120 includes heating element 122 (a heating element may also be referred to as a "heating source" or "heat source"). Heating element 122 is positioned in thermal contact with the first surface 162 of the porous structure 160 and is adapted for heating the first surface 162. The heating element 122 may be in the form of a susceptor, resistance heating element or microwave heating element. Although not shown in the drawings, an induction coil and an insulation barrier may be used in combination with the heating element 122. The heating element 122 may be positioned above and aligned perpendicular to the porous structure 160, as illustrated in FIG. 1. The heating element may be in the form of a vertically oriented cylindrical structure with a center opening to permit the flow of gas through the center opening away from the porous structure 160. Alternatively, the heating element 122 may be positioned above or apart from and aligned parallel with the first surface 162. The heating element 122 may be positioned at an inclined angle relative to the first surface 162. The heating element 122 may be spaced sufficiently from the porous structure 160 to permit gas flowing through the porous structure to flow away from the porous structure. A protective shroud (not shown in the drawings) may be positioned between the heating element 122 and the porous structure 160 to protect the heating element from reactive gases forming solid deposits on the heating element. The protective shroud may be made of any suitable material, for example, graphite.

The densification unit 120 includes lower wall 124, and cylindrical wall section 126. Cylindrical wall section 126 surrounds support structure 140 and porous structure 160. The densification unit 120 includes upper wall 127 and exhaust outlet 128. The upper wall 127 may form part of the heating element 122. The densification unit 120 includes insulation layer 130 which is positioned between the cylindrical wall section 126, and the support structure 140 and porous structure 160. The use of insulation layer 130 is optional. The densification unit 120 includes gas inlet 132.

The densification chamber 100 includes exhaust outlet 102 which may be connected to a vacuum system which is not shown in the drawings. The vacuum system may comprise any vacuum system capable of reducing the pressure within the densification chamber 100 to a level of about 1 torr or less, and in one embodiment to a level of about 0.1 torr or less. The vacuum system may also be adapted for withdrawing exhaust gases from the densification chamber 100 through outlet 102 during the densification process.

The support structure 140 has a first surface 148 which may be positioned opposite the second surface 164 of the porous structure 160. The first surface 148 may also function as part of the cooling element 142. A first open space 150 may be positioned between the first surface 148 of the support structure 140 and the second surface 164 of the porous structure 160. The first open space 150 may be positioned within the side walls of seal ring 180. The first open space 150 may be adapted for receiving gas flowing from the gas inlet 132 into contact with the second surface 164 of the porous structure 160.

A second open space 152 may be positioned adjacent to the peripheral surface 166 of the porous structure 160. The second open space 152 may be adapted for permitting gas to flow out of the porous structure 160 through the peripheral surface 166.

A third open space 154 may be positioned adjacent the first surface 162 of the porous structure 160. The third open space 154 may be adapted for permitting gas to flow out of the porous structure 160 through the first surface 162. When the heating element 122 is positioned parallel to the first surface 162, the third open space 154 may be positioned between the heating element 122 and the first surface 162.

When the porous structure is in the form of an annular disk, a fourth open space or center opening 165 may be positioned adjacent to the inside peripheral surface 167 of the porous structure 160. The fourth space 165 may be adapted for permitting gas to flow out of the porous structure 160 through the inside peripheral surface 167.

The seal ring 180 illustrated in FIG. 3 may have a layer of graphite cement 182 positioned between it and the second generally planar surface 164 of the porous structure 160. The seal ring 180 may also have a gasket 184 positioned between it and the first surface 148. Use of the layer of graphite cement 182 and gasket 184 is optional. Clamps 185 and 186 may be provided for holding the porous structure 160, seal ring 180 and support structure 140 together. The seal ring 180 may comprise a graphite seal ring. The gasket 184 may comprise a flexible graphite gasket. The gasket 184 may be made of GRAFOIL® which is a flexible graphite available from GrafTech International Holdings Inc., 12900 Snow Road Parma, Ohio, USA, 44130. Although two clamps, namely clamps 185 and 186, are illustrated in FIG. 3, any desired number of clamps may be used, for example, one, two, three, four, five, six, etc.

Figure 4:
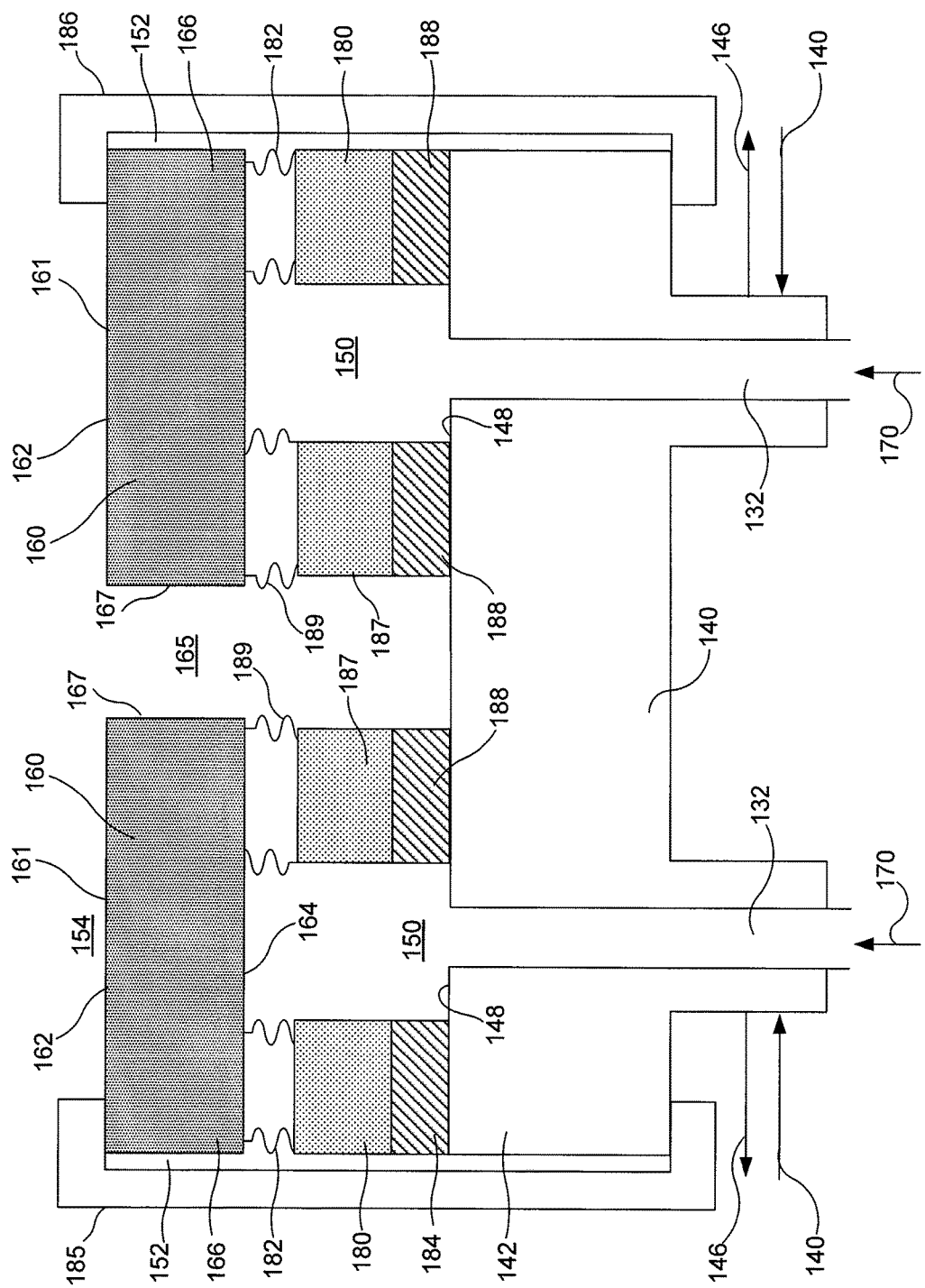
FIG. 4 is a schematic illustration of an apparatus similar to the apparatus illustrated in FIG. 3 with the exception that the porous structure illustrated in FIG. 4 is in the form an annular ring while the porous structure illustrated in FIG. 3 is in the form a circular ring.
Figure 5:
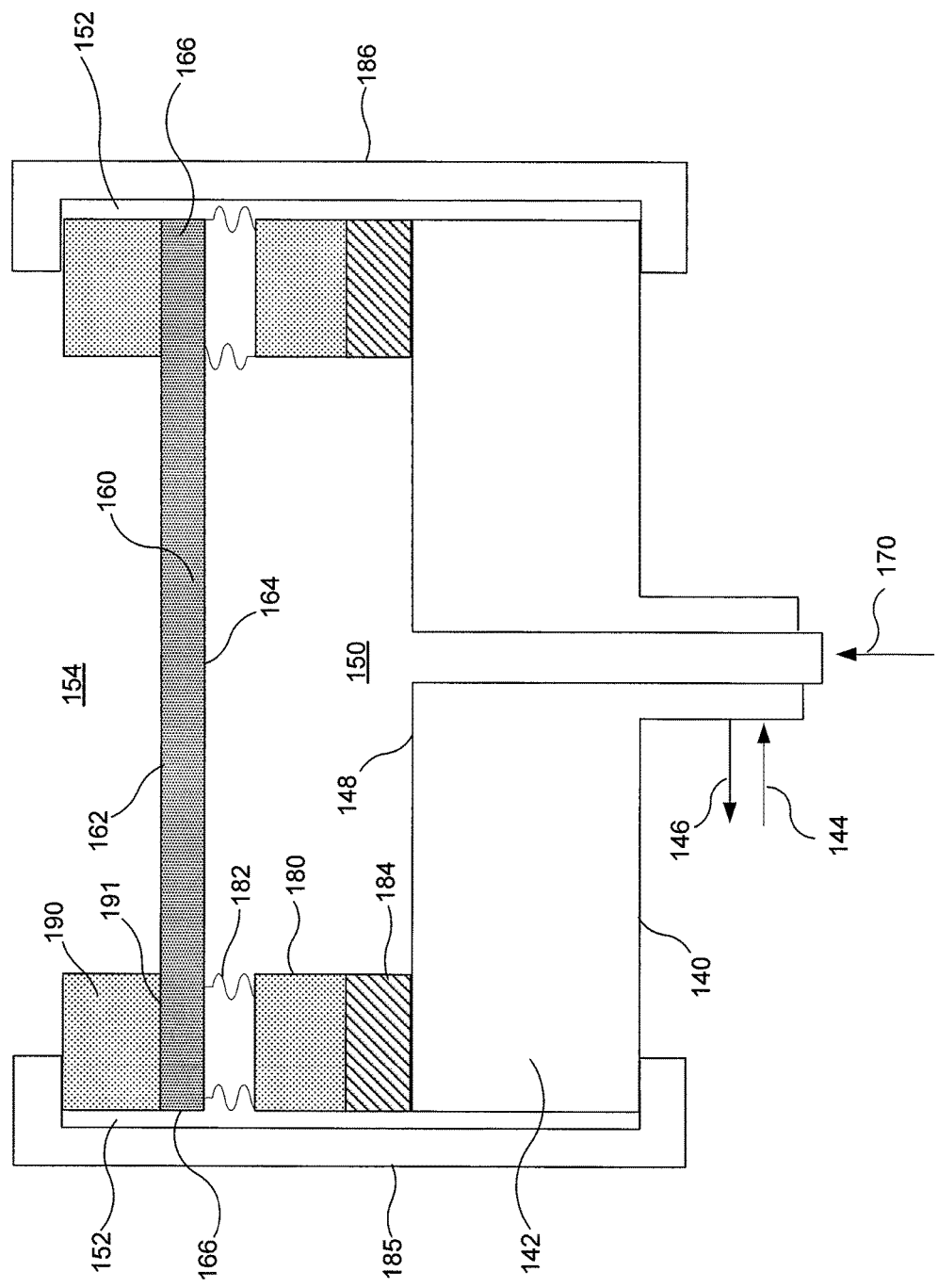
FIG. 5 is a schematic illustration of an apparatus similar to the apparatus illustrated in FIG. 3 with the exception that that apparatus illustrated in FIG. 5 includes a seal ring overlying the outer edge of the upper surface of the porous structure.
Figure 6:
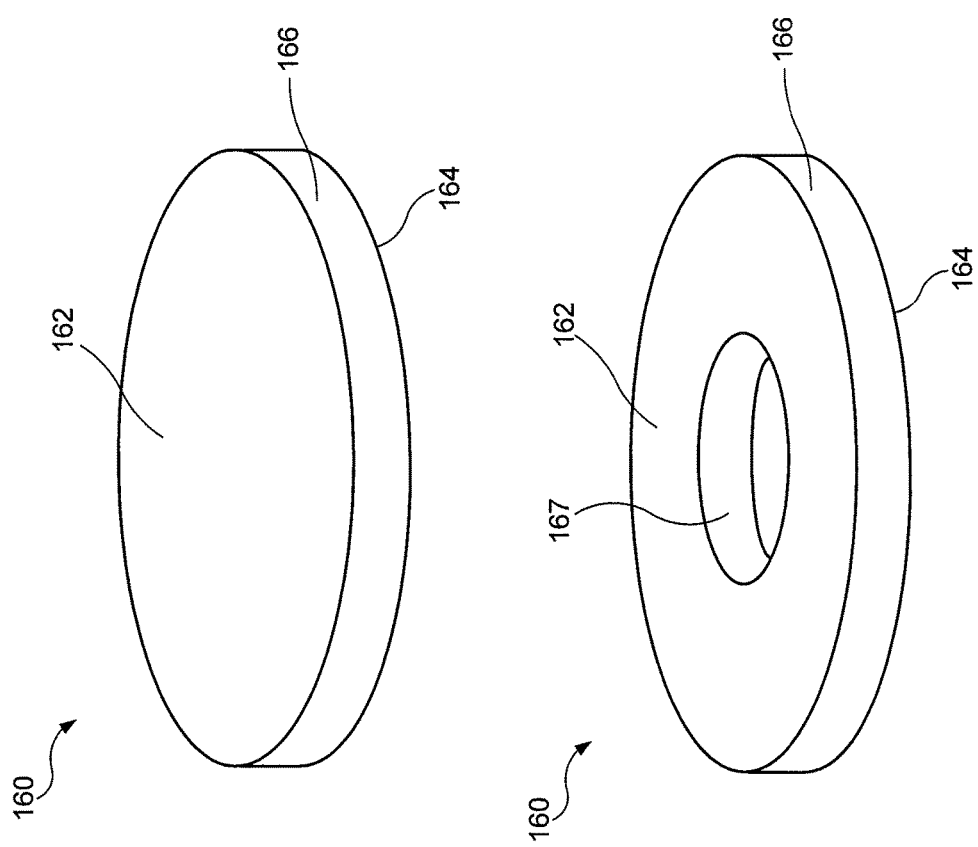
FIG. 6 shows schematic illustrations of two porous structures that may be densified pursuant to the disclosed invention.
Figure 9:
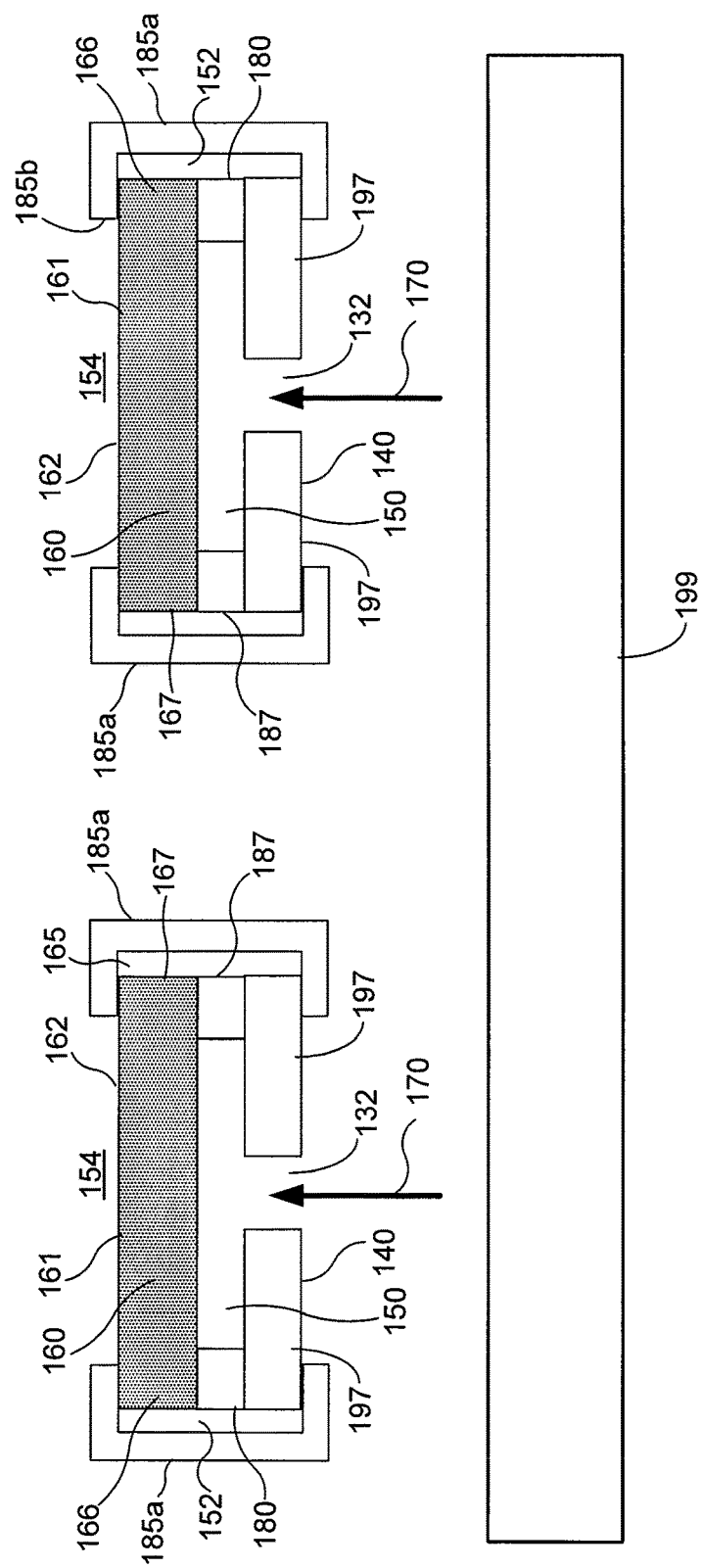
FIG. 9 is a schematic illustration of a densification chamber that may be used for densifying one or more porous structures to form one or more composite structures.

The apparatus illustrated in FIG. 4 is the same as illustrated in FIG. 3 with the exception that porous structure 160 is in the form of an annular disk rather than a circular disk. The porous structure 160 illustrated in FIG. 4 includes center opening 165, which may be referred to as a fourth open space. The porous structure 160 has an outside peripheral surface 166 and an inside peripheral surface 167. The porous structure 160 has a center line 161 which is in the form of a circular ring in the annular part of the porous structure 160. The apparatus may have an outside seal ring 180, which may be the same as the seal ring 180 illustrated in FIG. 3, and an inside seal ring 187. The inside seal ring 187 may have a layer of cement 189 positioned between it and the second generally planar surface 164 of the porous structure 160. The seal ring 187 may also have a gasket 188 positioned between it and the first surface 148. The layer of cement 189 and gasket 188 may be optional. The seal ring 187 may comprise a graphite seal ring. The layer of cement 189 may comprise a graphite cement. The gasket 188 may comprise a flexible graphite gasket. The gas inlet 132 and the first space 150 may each have an annular shape.

The apparatus illustrated in FIG. 5 is the same as illustrated in FIG. 3 except that the porous structure 160 has a reduced thickness, and seal ring 190 may overlie the outer portion 191 of the first generally planar surface 162 of porous structure 160. The seal ring 190 may comprise a graphite seal ring. Clamps 185 and 186 may hold seal ring 190 against the first generally planar surface 162. The clamps may also hold the porous structure 160, seal ring 180 and support structure 140 together.

In operation, the porous structure 160 may be mounted on the support structure 140. The heating element 122 may be heated to heat the first surface 162 to a temperature in the range from about 800 to about 1700° C., and in one embodiment in the range from about 850 to about 1500° C., and in one embodiment in the range from about 900 to about 1350° C. A coolant may flow in the cooling element 142 to provide cooling to the second surface 164 of the porous structure 160. The temperature of the second surface 164 may be in the range from about 400 to about 1500° C., and in one embodiment in the range from about 500 to about 1200° C., and in one embodiment in the range from about 600 to about 1100° C. The difference in temperature between the temperature of the first surface 162 and the second surface 164 establishes a thermal gradient across the thickness of the porous structure 160. The thickness of the porous structure 160 may be the length extending from the first generally porous surface 162 to the second generally porous surface 164. The thermal gradient across the thickness of the porous structure may be in the range from about 25 to about 450° C. per centimeter of thickness (° C./cm) of the porous structure 160, and in one embodiment in the range from about 50 to about 400° C./cm, and in one embodiment in the range from about 100 to about 350° C./cm, and in one embodiment in the range from about 150 to about 300° C./cm.

The vacuum system may be used to establish an absolute pressure in the open spaces 152, 154 and 165 in the range from about 1 to about 760 torr, and in one embodiment in the range from about 5 to about 100 torr, and in one embodiment in the range from about 5 to about 50 torr, and in one embodiment in the range from about 5 to about 20 torr, and in one embodiment about 10 torr. The feed gas may flow in gas inlet 132, as indicated by arrow 170, and from the inlet 132 into the space 150 in contact with the second surface 164 of the porous structure 160. The absolute pressure in the open space 150 may be higher than in the open space 154 and may be in the range from about 5 to about 1000 torr, and in one embodiment in the range from about 5 to about 500 torr, and in one embodiment in the range from about 10 to about 200 torr. The difference in pressure between the pressure in the open space 150 and the pressure in the open space 154 may be in the range from about 5 to about 400 torr, and in one embodiment in the range from about 20 to about 200 torr. The difference in pressure between the pressure in the open space 150 and the pressure in the open spaces 152 and 165 may be in the range from about 5 to about 400 torr, and in one embodiment in the range from about 20 to about 200 torr. The pressure gradient across the thickness of the porous structure 160 from the second surface 164 to the first surface 162 may be in the range from about 0.5 to about 1000 torr/cm, and in one embodiment in the range from about 1 to about 500 torr/cm, and in one embodiment in the range from about 2 to about 100 torr/cm, and in one embodiment in the range from about 5 to about 50 torr/cm. The pressure gradient across the porous structure 160 from the second surface 164 to the peripheral surfaces 166 and 167 may be in the range from about 2 to about 1000 torr/cm, and in one embodiment in the range from about 5 to about 500 torr/cm.

The feed gas may flow from the open space 150 into the porous structure 160 wherein at least part of the gas undergoes thermal pyrolysis and forms a solid residue in the pores of the porous structure 160. The gases that do not undergo thermal pyrolysis (i.e., the unreacted gases) as well as any by-product gases that may be generated during the densification process may flow through the porous structure 160 and out of the densification chamber 100 through the gas outlet 102, as indicated by arrow 172. As the process continues, the build up of solid residue within the porous structure may result in a gradual densification of the porous structure 160 and the formation of the composite structure 160. The densification generally proceeds from the hot side or the first surface 162 to the cold side or the second surface 164. During an early stage of the densification process, the gases may flow through the porous structure 160 to and through the first planar surface 162 and to and through the peripheral surfaces 166 and 167 as illustrated in FIG. 7. During a late stage of the densification process the gases may flow through the porous structure 160 to and through the peripheral surfaces 166 and 167 as illustrated in FIG. 8. The early stage densification, at least during the formation of a carbon/carbon composite, may be conducted over a period of time in the range from about the first half to about the first three-quarters of the densification process. The late stage densification may be conducted over a period of time in the range from about the last half to about the last one-quarter of the densification process. The overall densification process may be conducted over a period of time in the range from about 10 to about 250 hours, and in one embodiment in the range from about 15 to about 175 hours, and in one embodiment in the range from about 24 to about 100 hours, and in one embodiment in the range from about 24 to about 75 hours, and in one embodiment in the range from about 24 to about 65 hours.

In one embodiment, the thermal gradient and/or pressure gradient across the porous structure may be varied during the densification process in order to optimize the densification of the porous structure. This may be accomplished by changing the temperature of the coolant in the cooling element 142 and/or changing the flow rate of the coolant in the cooling element. This may also be accomplished by changing the type of coolant used in the cooling element 142. When the coolant is water, the water may be chilled prior to entering the cooling element 142 to increase the temperature differential between porous structure 160 and the cooling element 142. This may increase the heat transfer rate between porous structure 160 and the cooling element 142. The heat transfer rate may be decreased during the densification process by allowing the water temperature in the cooling element 142 to rise. The pressure within the cooling element 142 may be increased to prevent the water from vaporizing. Coolants other than water, such as various oils with higher boiling points than water, may be used as the coolant. The coolants with higher boiling points than water may be used to operate the cooling element 142 at higher temperatures and thereby reduce the temperature differential between the cooling element 142 and the porous structure 160. The flow rate within the cooling element 142 may be varied to vary the temperature within the cooling element. For example, a relatively high flow rate may tend to maintain the cooling element 142 at a relatively cool temperature, and a relatively low flow rate may allow the temperature of the cooling element 142 to increase. The pressure gradient across the porous structure may be varied during the densification process by decreasing or increasing the feed gas flow rates. For example, the increase in the pressure gradient that occurs as a preform densifies may be limited to a maximum value by lowering the feed gas flow rates during the latter stages of the densification process.

The thermal gradient may also be varied by moving the cooling element away from the porous structure during the densification process and/or moving the porous structure away from the cooling element during the densification process. This may be accomplished using the densification fixtures illustrated in FIG. 2. Referring to FIG. 2, the densification fixtures 125 include support pipe 141, threaded rod 143, nut 151, bottom plate 149, clamps 147 at the outside diameter of the porous structure 160, top clamp 157 which may include holes for gas flow, seal ring 153, lower clamp/seal 158, and insulators 133. The bottom plate 149, nut 151, top clamp 157, and lower clamp/seal 158 may be made of graphite. The insulators 133 may be made of carbon foam. The densification fixtures 125 include gas inlet 132, and temperature indicator leads 156. Also included are first open space 150, second open space 152, third open space 154 and fourth open space 165 which are the same as described above. The densification process may be conducted by establishing a thermal gradient across the porous structure 160 as discussed above using heating elements (not shown in FIG. 2) and a coolant (e.g., water or oil) in cooling element 145. The reactant gas may flow through the support pipe 141 into the first space 150 and from the first space 150 into the porous structure 160 as described above and as shown in FIG. 2 by arrows 155. The gap between the porous structure 160 and the cooling element 145 may be adjusted by moving the bottom plate 149 up or down relative to the cooling element 145. The bottom plate 149 may be moved up or down by turning the threaded rod 143.

In various embodiments, the porous structure may be in the form of a circular disk or an annular disk with an outside diameter in the range from about 10 to about 80 cm, a thickness in the range from about 0.1 to about 10 cm, and the time required to make the composite structure may be in the range from about 10 to about 100 hours.

The porous structure may be in the form of a circular disk or an annular disk having physical properties as described herein.

The density of the porous structure 160 may increase gradually as the process progresses and the composite structure is formed. The flow rate of the gas through the second surface 164 may be reduced to maintain a substantially constant difference in pressure between the pressure at second surface 164 and the pressure at the first surface 162. The temperature of the heating element 122 may be decreased gradually while the temperature of the cooling element 142 is increased. Alternatively, the temperature of the heating element 122 may be increased gradually while the temperature of the cooling element 142 is maintained constant. The temperature of the cooling element 142 may be decreased gradually while the temperature of the heating element 122 is maintained constant.

The carbon/carbon (C/C) composites produced using the inventive process may have an overall average density of at least about 1.5 g/cc, and in one embodiment in the range from about 1.5 to about 2.2 g/cc, and in one embodiment in the range from about 1.5 to about 2.1 g/cc, and in one embodiment in the range from about 1.7 to about 2 g/cc, and in one embodiment in the range from about 1.7 to about 1.9 g/cc, and in one embodiment in the range from about 1.8 to about 1.9 g/cc. The SiC/SiC (SiC porous structure densified with SiC) composites may have an overall average density in the range up to about 3.2 g/cc. The C/SiC composites (C porous structure densified with SiC) may have an overall average density in the range up to about 2.6 g/cc. These composites may have average porosities in the range up to about 15%, and in one embodiment in the range from about 1% to about 15%, and in one embodiment in the range from about 1% to about 10%, and in one embodiment in the range from about 1 to about 5%. The carbon/carbon composites may have substantially rough laminar microstructures throughout about 80% to about 100% of their structures, and in one embodiment from about 95% to about 100%.

The composite structure may be heat treated subsequent to densification in a vacuum or an inert atmosphere at a temperature in the range from about 1600 to about 2800° C., and in one embodiment in the range from about 1650 to about 2200° C., for a period of time in the range up to about 10 hours, and in one embodiment in the range up to about 2 hours. When the composite structure is a carbon/carbon composite intended for use as an aircraft brake disk, this heat treating step may be used to adjust the friction and/or wear properties of the composite. When the carbon/carbon composite is intended for used as an aircraft brake disk, the microstructure of the composite may comprise a substantially rough laminar content in the range from about 80 to about 100% of its structure, and in one embodiment in the range from about 95 to about 100%.

It has been found that control of the temperature gradient, as described herein, may be used to modify, control, or adjust densification of a porous structure. For example, a temperature gradient may be increased (e.g., via increasing the temperature of a heating element or decreasing the temperature of a cold plate) or decreased (e.g., via decreasing the temperature of a heating element or increasing the temperature of a cold plate) to control rate of deposition. Such temperature gradient control/adjustment may be performed to achieve improved deposition and/or penetration of gas into and/or on the porous structure.

It has also been found that control of a pressure gradient, as described herein, may be used to modify, control, or adjust densification of a porous structure. For example, a pressure gradient may be increased or decreased (e.g., by varying the pressure at which gas flows) to further control rate of deposition. Such pressure gradient control/adjustment may be performed to achieve improved deposition and/or penetration of gas into and/or on the porous structure.

A change in the direction of gas flow may also address various problems associated with conventional densification means. In addition, a change in gas flow may be accompanied by a temperature gradient adjustment to achieve some or all of the benefits of the adjusted temperature gradient described herein.

It is possible, depending on various process parameters, for the exterior pores of a porous structure to become sealed as time in the furnace increases, thus limiting the ability of a gas to penetrate into the porous structure and negatively affecting the density of the final product. By adjusting or controlling the temperature gradient during processing, densification uniformity is improved.

Temperature gradient adjustment may also enhance the uniformity of the deposition on the exterior surfaces of the porous structure. For example, temperature gradient adjustment may yield densified porous structures having uniform depositions on both faces.

Further, temperature gradient adjustment may be used to deposit a ceramic precursor on both faces of a porous structure. For example, with reference to FIG. 1, a densification process may begin by creating a temperature gradient between heating element 122 and cooling element 142. After a period of densification, a ceramic precursor may optionally be introduced into the gas flow to deposit a ceramic onto a first surface of porous structure 160. The ceramic, as used herein, may include, for example, SiC, other ceramics disclosed herein, and those not named herein. During densification processing, the temperature gradient could be adjusted and/or the gas flow reversed. After a period of densification under the adjusted temperature gradient, a ceramic precursor may optionally be introduced into the gas flow to deposit a ceramic onto a second surface of porous structure 160. Accordingly, in such an embodiment, densification occurs and a ceramic precursor is deposited on two surfaces of porous structure 160.

In various embodiments, gas flow direction may be adjusted or reversed so that gas is directed into a first inbound surface of a porous structure and out an outbound surface of the porous structure. The first inbound surface may comprise at least one of the first surface, the second surface, the inner diameter surface and the outer diameter surface. The outbound surface may not comprise the first inbound surface. For example, in an embodiment, the first inbound surface is the first surface and the outbound surface may be one or more of the second surface, the inner diameter surface and the outer diameter surface. Gas flow adjustment may occur, and the gas may be directed into a second inbound surface of the porous structure where the second inbound surface comprises the first inbound surface. For example, the first inbound surface is the first surface and the second inbound surface is the second surface.

Figure 10:
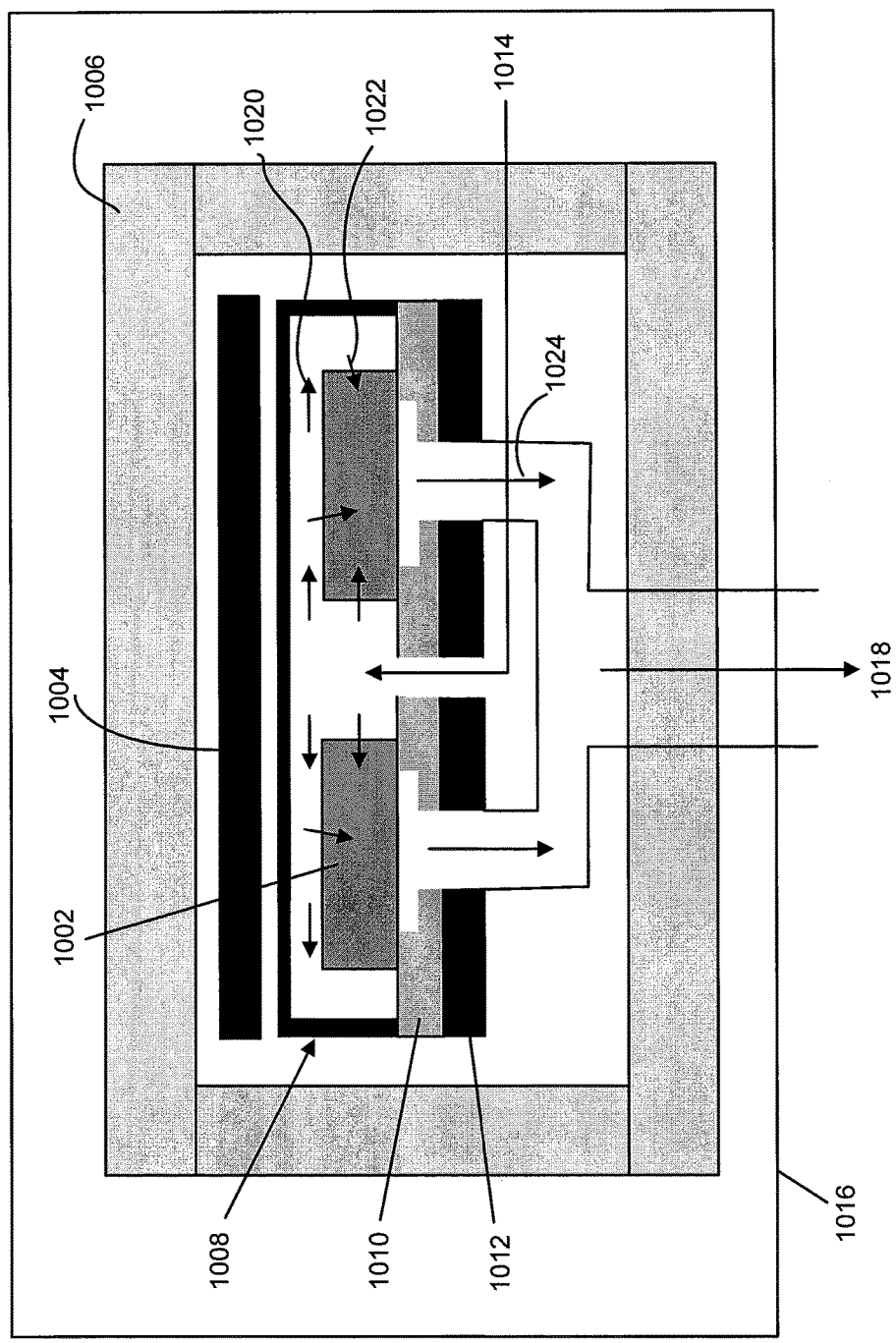
FIG. 10 illustrates an exemplary embodiment of a porous structure in a furnace.

With reference to FIG. 10, a further embodiment is illustrated. Porous structure 1002 may be placed in cartridge 1008 within pressure vessel 1016. Pressure vessel 1016 may comprise insulation 1006. Porous structure 1002 may be in the form of an annular disk, though other geometries and configurations are contemplated. Porous structure 1002 comprises a first surface, a second surface, and at least one other surface connecting the first surface and the second surface. Porous structure 1002's first surface is the surface in thermal contact with heating element 1004. Porous structure 1002's second surface is the surface in thermal contact with cartridge base plate 1010. The at least one other surface comprises an inside peripheral surface and an outside peripheral surface. The inside peripheral surface (also referred to as the "ID surface") of porous structure 1002 surrounds the ID space of porous structure 1002. The outside peripheral surface (also referred to as the "OD surface") of porous structure 1002 surrounds the OD space of porous structure 1002.

Cartridge 1008 may be placed on cold plate 1012. Cold plate 1012 may comprise a cooling element as described above. For example, cold plate 1012 may comprise one or more cooling conduits or channels. Cold plate 1012 may use any suitable fluid coolant such as water, nitrogen, oil, and the like. The coolant may flow into and out of the cold plate 1012. Alternatively, cold plate 1012 may comprise one or more non-fluid cooling elements.

Heating element 1004 may be outside cartridge 1008. Heating element 1004 may comprise any of the types and configurations of heating elements described above. Cartridge 1008 comprises cartridge base plate 1010. Porous structure's 1002 second surface is close to or in contact with cartridge base plate 1010 and may be held in place by a vacuum or partial vacuum. Accordingly, no mechanical clamping is necessary in such a configuration.

Heating element 1004 and/or cold plate 1012 may be used during densification to create a temperature gradient across the first surface and the second surface of porous structure 1002 in any manner described herein. At any time during processing, the temperature of heating element 1004 may be increased or decreased and/or the temperature of cold plate 1012 may be increased (by, for example, reducing the flow rate of a cooling liquid) or decreased to effect temperature gradient adjustment. By such adjustment of either heating element 1004 or cold plate 1012, the temperature gradient may thus also be adjusted. In this manner, the temperature gradient may be increased (i.e., the difference in temperatures made greater) or decreased (i.e., the difference in temperatures reduced).

Cartridge 1008 may be positioned such that there is a gap between a surface of porous structure 1002 (such as the first surface) and a portion of cartridge 1008. A gap may be any size space that may allow gas to flow into and/or through the gap. The gap between porous structure 1002 and cartridge 1008 may be from about $\frac{1}{32}$ of an inch to about 3 inches, and in various embodiments, it is about ½ inch. Cartridge 1008 may allow for adjusting the gap between porous structure 1002 and a portion of cartridge 1008 before, after, or during densification.

Feed gas 1014 comprises any reactant gas and/or one or more precursors as described herein. Feed gas 1014 may be introduced within the space bound by the ID surface of porous structure 1002. Feed gas 1014 may flow through the ID surface of porous structure 1002. Feed gas 1014 may also flow through the gap between cartridge 1008 and porous structure 1002, as shown by flow direction 1020, of which some gas may flow through the first surface of the porous structure. Feed gas 1014 may also flow through the OD surface of porous structure 1002, as shown by flow direction 1022. In such configuration, feed gas 1014 flows into porous structure 1002 via entry at the ID surface, the OD surface, and the first surface and exits porous structure 1002 via the second surface, as shown by flow direction 1024. Flow direction 1024 may be conducted to exit the furnace as exhaust 1018.

In various embodiments, a temperature gradient may be controlled in a densification process and the porous structure removed from the process vessel (e.g. pressure vessel) and subjected to a traditional densification process to achieve final density.

Figure 11:
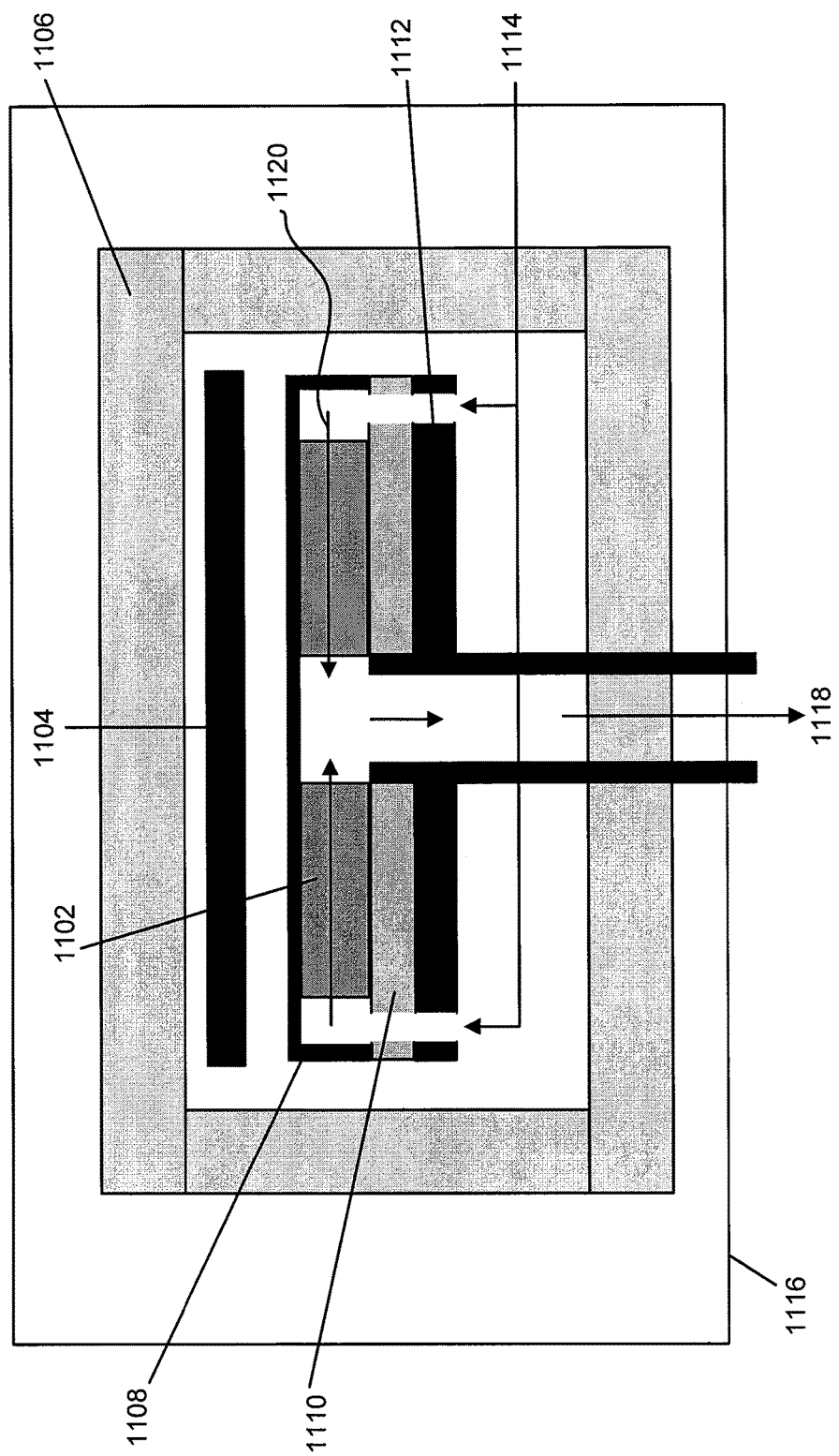
FIG. 11 illustrates a further exemplary embodiment of a porous structure in a furnace.

With reference to FIG. 11, a further embodiment is illustrated. Porous structure 1102 may be placed in cartridge 1108 within pressure vessel 1116. Pressure vessel 1116 may comprise insulation 1106. Porous structure 1102 may be in the form of an annular disk, though other geometries and configurations are contemplated. Porous structure 1102 has a first surface, a second surface, and at least one other surface connecting the first surface and the second surface. Porous structure's 1102 first surface is the surface in thermal contact with heating element 1104. Porous structure's 1102 second surface is the surface in thermal contact with cartridge base plate 1110. The at least one other surface comprises an inside peripheral surface and an outside peripheral surface. The inside peripheral surface (also referred to as the "ID surface") of porous structure 1102 surrounds the ID space of porous structure 1102. The outside peripheral surface (also referred to as the "OD surface") of porous structure 1102 surrounds the OD space of porous structure 1102.

Cartridge 1108 may be placed on cold plate 1112. Heating element 1104 may be outside cartridge 1108. Cartridge 1108 comprises cartridge base plate 1110. Porous structure's 1102 second surface is in thermal contact with cartridge base plate 1110.

Heating element 1104 and/or cold plate 1112 may be used during densification to create a temperature gradient across the first surface and the second surface of porous structure 1102 in any manner described herein above. At any time during processing, the temperature of heating element 1104 may be increased or decreased and/or the temperature of cold plate 1112 may be increased (by, for example, reducing the flow rate of a cooling liquid) or decreased to effect temperature gradient adjustment. By such adjustment of either heating element 1104 or cold plate 1112, the temperature gradient may thus also be adjusted. In this manner, the temperature gradient may be increased (i.e., the difference in temperatures made greater) or decreased (i.e., the difference in temperatures reduced).

Cartridge 1108 is positioned such that there is substantially no gap between a surface of porous structure 1102 (such as the first surface) and a portion of cartridge 1108. Accordingly, cartridge 1108 may be in contact with a portion of a surface of porous structure 1102 and, as shown cartridge 1108 is in contact with the first surface of porous structure 1102. For example, the first surface of porous structure 1102 may be in contact with cartridge 1108 or, for example, the first surface of porous structure 1102 may be so close to cartridge 1108 that gas is substantially impeded from flowing between the first surface of porous structure 1102 and cartridge 1108. Cartridge 1108 may allow for adjustment such that a gap could be created between porous structure 1102 and a portion of cartridge 1108.

Feed gas 1114 comprises any precursor as described herein. Feed gas 1114 may be introduced within the OD space of porous structure 1102. Feed gas 1114 may flow through the OD surface of porous structure 1102, as shown by flow direction 1120. As the first surface of porous structure 1102 and cartridge 1108 may be in contact, substantially little of feed gas 1114 would flow between the first surface of porous structure 1102 and cartridge 1108. In such configuration, feed gas 1114 flows into porous structure 1102 via entry at the OD surface and exits porous structure 1102 via the ID surface. Flow direction 1118 illustrates the gas exiting from the ID surface of porous structure 1102 and also illustrates that flow direction 1118 may be routed from pressure vessel 1116 as exhaust.

Figure 12:
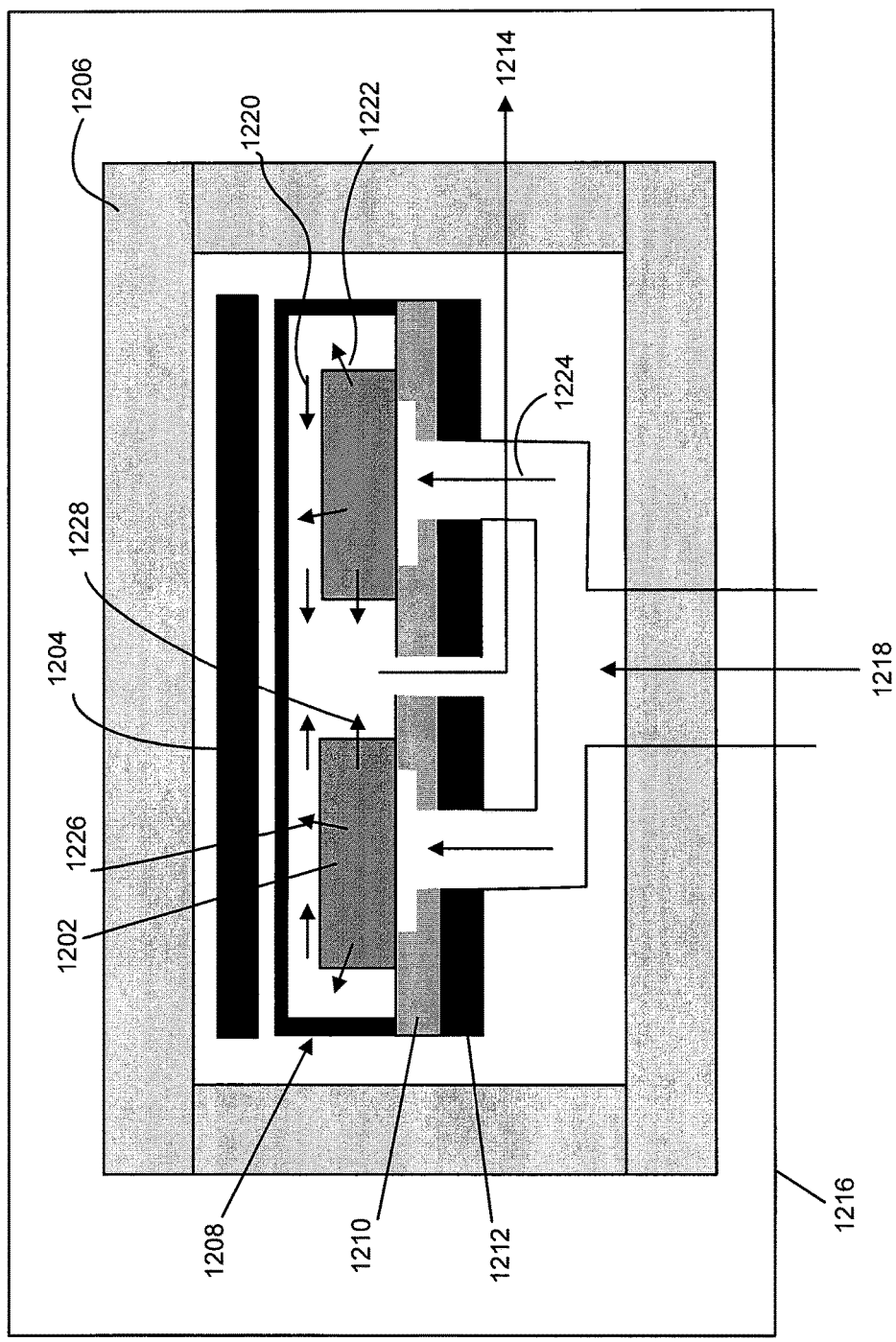
FIG. 12 illustrates a further exemplary embodiment of a porous structure in a furnace.

With reference to FIG. 12, a further embodiment is illustrated. Porous structure 1202 may be placed in cartridge 1208 within pressure vessel 1216. Pressure vessel 1216 may comprise insulation 1206. Porous structure 1202 may be in the form of an annular disk, though other geometries and configurations are contemplated. Porous structure 1202 may comprise a first surface, a second surface, and at least one other surface connecting the first surface and the second surface. In an embodiment, porous structure's 1202 first surface is the surface in thermal contact with heating element 1204. Porous structure's 1202 second surface is the surface in thermal contact with cartridge base plate 1210. The at least one other surface comprises the inside peripheral surface (also referred to as the "ID surface") of porous structure 1202. The outside peripheral surface (also referred to as the "OD surface") of porous structure 1202 surrounds the OD space of porous structure 1202.

Cartridge 1208 may be placed on cold plate 1212. Cold plate 1212 may comprise a cooling element as described above. For example, cold plate 1212 may comprise one or more cooling conduits or channels. Cold plate 1212 may use any suitable fluid coolant such as water, nitrogen, oil, and the like. The coolant may flow into and out of the cold plate 1212. Alternatively, cold plate 1212 may comprise one or more non-fluid cooling elements.

Heating element 1204 may be outside cartridge 1208. Heating element 1204 may comprise any of the types and configurations of heating elements described above. Cartridge 1208 comprises cartridge base plate 1210. Porous structure's 1202 second surface is close to or in contact with cartridge base plate 1210.

Heating element 1204 and/or cold plate 1212 may be used during densification to create a temperature gradient across the first surface and the second surface of porous structure 1202 in any manner described herein. At any time during processing, the temperature of heating element 1204 may be increased or decreased and/or the temperature of cold plate 1212 may be increased (by, for example, reducing the flow rate of a cooling liquid) or decreased to effect temperature gradient adjustment. By such adjustment of either heating element 1204 or cold plate 1212, the temperature gradient may thus also be adjusted. In this manner, the temperature gradient may be increased (i.e., the difference in temperatures made greater) or decreased (i.e., the difference in temperatures reduced).

Cartridge 1208 may be positioned such that there is a gap between a surface of porous structure 1202 (such as the first surface) and a portion of cartridge 1208. A gap may be any size space that may allow gas to flow into and/or through the gap. The gap between porous structure 1202 and cartridge 1208 may be from about 1/32 of an inch to about 3 inches, and in various embodiments, it is about ½ inch. Cartridge 1208 may allow for adjusting the gap between porous structure 1202 and a portion of cartridge 1208 before, after, or during densification.

Feed gas 1218 comprises any reactant gas and/or one or more precursors as described herein. Feed gas 1218 may be introduced below the second surface of porous structure 1202 and flow through the second surface of porous structure 1202. Feed gas 1218 may exit porous structure 1202 through the first surface of porous structure 1202, the ID surface of porous structure 1202, the OD surface of porous structure 1202, and combinations thereof. For example, flow direction 1222 illustrates feed gas 1218 exiting through the OD surface of porous structure 1202. Also for example, flow direction 1226 illustrates feed gas 1218 exiting through the first surface of porous structure 1202. Flow direction 1228 illustrates feed gas 1218 exiting through the ID surface of porous structure 1202. Although not shown in FIG. 12, in various embodiments, cartridge 1208 may be in substantial contact with the first surface of porous structure 1202, thus preventing gas flow exit from the first surface of porous structure 1202. Flow directions 1226, 1228, and 1222 may be conducted to exit the furnace as exhaust 1214.

Figure 13:
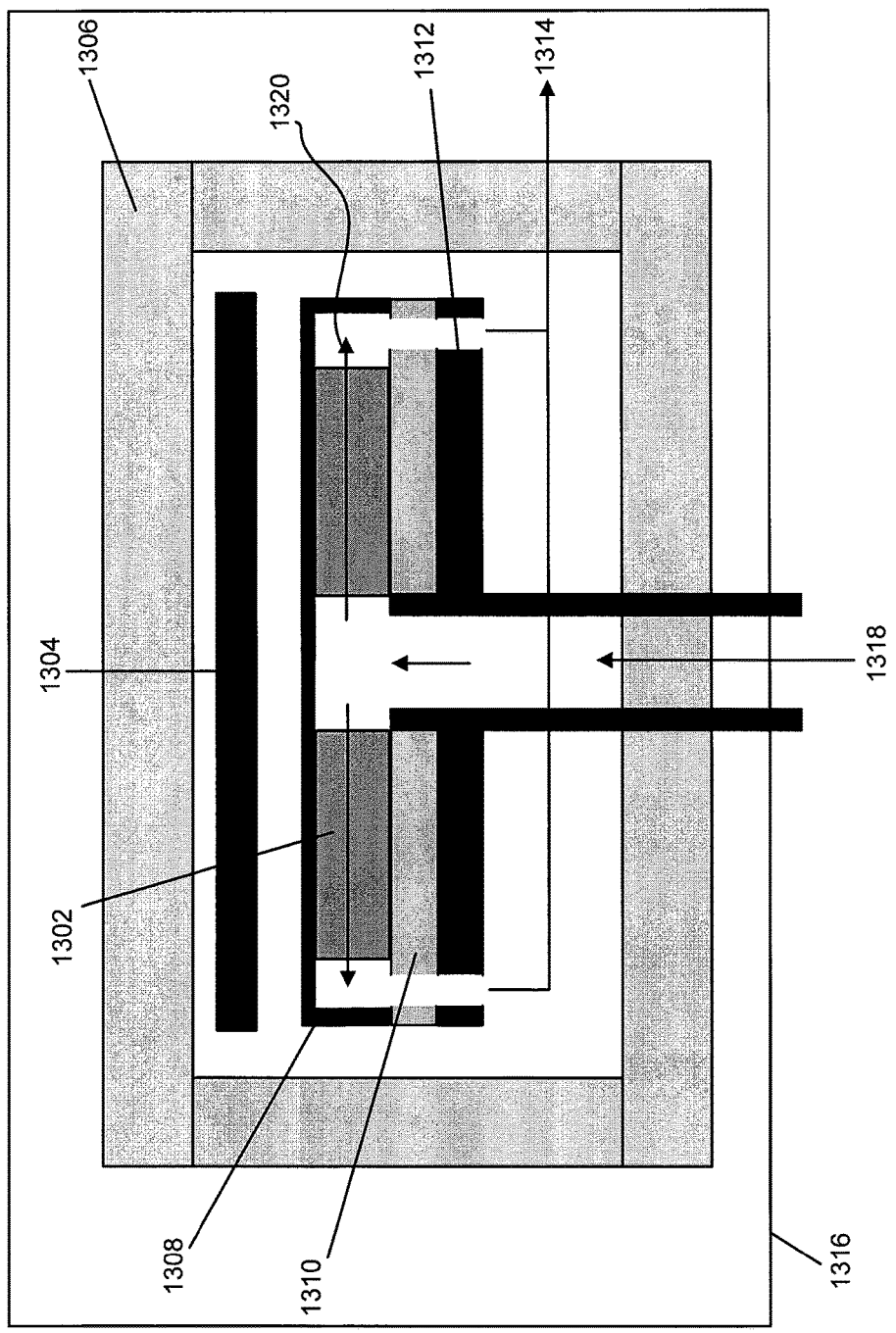
FIG. 13 illustrates a further exemplary embodiment of a porous structure in a furnace.

With reference to FIG. 13, a further embodiment is illustrated. Porous structure 1302 may be placed in cartridge 1308 within pressure vessel 1316. Pressure vessel 1316 may comprise insulation 1306. Porous structure 1302 may be in the form of an annular disk, though other geometries and configurations are contemplated. Porous structure 1302 has a first surface, a second surface, and at least one other surface connecting the first surface and the second surface. Porous structure's 1302 first surface is the surface in thermal contact with heating element 1304. Porous structure's 1302 second surface is the surface in thermal contact with cartridge base plate 1310. The at least one other surface comprises an inside peripheral surface and an outside peripheral surface. The inside peripheral surface (also referred to as the "ID surface") of porous structure 1302 surrounds the ID space of porous structure 1302. The outside peripheral surface (also referred to as the "OD surface") of porous structure 1302 surrounds the OD space of porous structure 1302.

Cartridge 1308 may be placed on cold plate 1312. Heating element 1304 may be outside cartridge 1308. Cartridge 1308 comprises cartridge base plate 1310. Porous structure's 1302 second surface is in thermal contact with cartridge base plate 1310.

Heating element 1304 and/or cold plate 1312 may be used during densification to create a temperature gradient across the first surface and the second surface of porous structure 1302 in any manner described herein above. At any time during processing, the temperature of heating element 1304 may be increased or decreased and/or the temperature of cold plate 1312 may be increased (by, for example, reducing the flow rate of a cooling liquid) or decreased to effect temperature gradient adjustment. By such adjustment of either heating element 1304 or cold plate 1312, the temperature gradient may thus also be adjusted. In this manner, the temperature gradient may be increased (i.e., the difference in temperatures made greater) or decreased (i.e., the difference in temperatures reduced).

Cartridge 1308 is positioned such that there is substantially no gap between a surface of porous structure 1302 (such as the first surface) and a portion of cartridge 1308. Accordingly, cartridge 1308 may be in contact with a portion of a surface of porous structure 1302 and, as shown cartridge 1308 is in contact with the first surface of porous structure 1302. For example, the first surface of porous structure 1302 may be in contact with cartridge 1308 or, for example, the first surface of porous structure 1302 may be so close to cartridge 1308 that gas is substantially impeded from flowing between the first surface of porous structure 1302 and cartridge 1308. Cartridge 1308 may allow for adjustment such that a gap could be created between porous structure 1302 and a portion of cartridge 1308.

Feed gas 1318 comprises any reactant gas and/or one or more precursors as described herein. Feed gas 1318 may be introduced within the ID space of porous structure 1302. Feed gas 1318 may flow through the ID surface of porous structure 1302, as illustrated. As the first surface of porous structure 1302 and cartridge 1308 may be in contact, substantially little of feed gas 1318 would flow between the first surface of porous structure 1302 and cartridge 1308. In such configuration, feed gas 1318 flows into porous structure 1302 via entry at the ID surface and exits porous structure 1302 via the OD surface. Flow direction 1320 illustrates the gas exiting from the OD surface of porous structure 1302 and also illustrates that flow direction 1320 may be routed from pressure vessel 1316 as exhaust 1314.

In various embodiments, a progressive thermal gradient and/or pressure gradient process may be used to enhance efficiency and/or to achieve uniform densification.

As described herein, it is generally advantageous to produce a porous structure having a final density of between about 1.75 g/cm³ to about 1.9 g/cm³, although final densities of from about 1.65 g/cm³ to about 2.1 g/cm³ may also be desirable in various embodiments, for example in embodiments producing carbon/carbon ("C/C") materials. In embodiments relating to ceramic matrix composites ("CMC") materials, it is generally advantageous to produce a porous structure having a final density of between about 2.0 g/cm³ to about 4.0 g/cm³, although final densities of from about 2.0 g/cm³ to about 6.0 g/cm³ may also be desirable. As used herein, a "final density" includes densities of between about 1.65 g/cm³ and about 2.1 g/cm³ when in the C/C material context and densities of between about 2.0 g/cm³ to about 6.0 g/cm³ when in the CMC context. Further, a "final density" may comprise a substantially uniform or uniform density. A porous structure may require more than one densification cycle to achieve a final density. By using progressive densification, porous structures may be densified with enhanced efficiency.

Various sizes of porous structures may benefit from progressive densification. Porous structures may take any physical shape as described herein, although in various embodiments a porous structure may be an annular disk. The thickness of a porous structure may be characterized as the height of the porous structure.

In embodiments relating to C/C materials, as used herein, a "thin" porous structure would have a thickness of between about 0.9 inches and about 1 inches, although thickness less than 0.9 inches would also be considered "thin." As used herein, a "medium" porous structure would have a thickness of between about 1 inch and about 1.5 inches. As used herein, a "thick" porous structure would have a thickness of between about 1.5 inches and about 3 inches, although preferably a thick porous structure would have a thickness of between about 1.5 inches and about 1.8 inches.

In embodiments relating to CMC materials, as used herein, a "thin" porous structure would have a thickness of between about 0.05 inches and about 0.25 inches. As used herein, a "medium" porous structure would have a thickness of between about 0.25 inches and about 1.0 inches. As used herein, a "thick" porous structure would have a thickness of between about 1.0 inches and about 4.0 inches.

As used in reference to progressive densification, a "porous structure" may refer to a single, continuous porous structure or a porous structure system. A porous structure system may comprise more than one porous structure.

Figure 14:
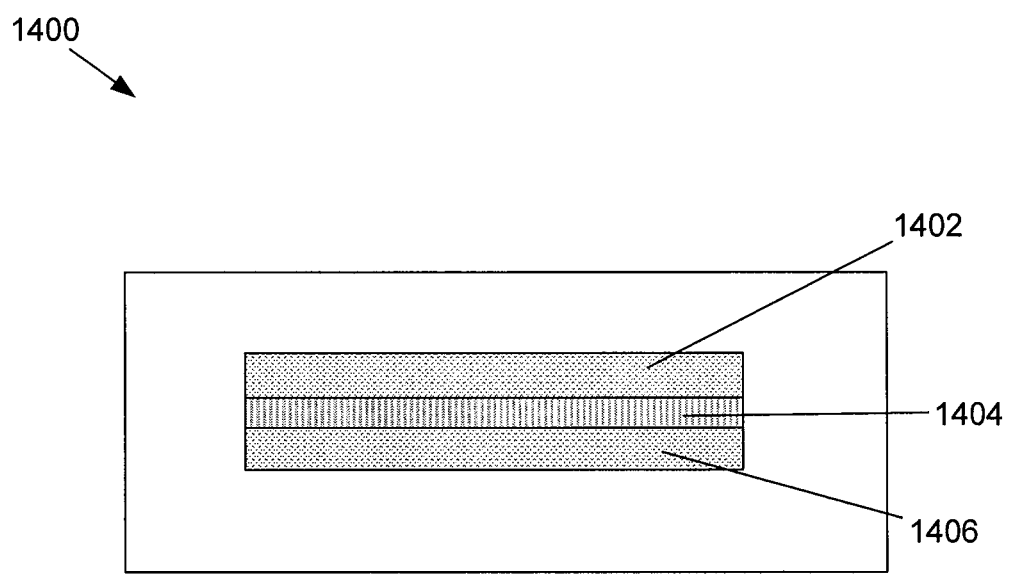
FIG. 14 illustrates an exemplary densified porous structure after a single densification run in cross section.

With reference to FIG. 14, densified porous structure 1400 is shown. Densified porous structure 1400 illustrates a porous structure that has undergone a thermal gradient/pressure gradient densification process, such as any described such process described herein. Densified porous structure 1400 may comprise a single porous structure or a porous structure system. Densified porous structure 1400 comprises three regions (regions 1402, 1404, and 1406) having different densities. As one skilled in the art would appreciate, density within a certain region may vary, however, regions 1402, 1404, and 1406 have different average densities. In various embodiments, after a single densification cycle, regions 1402, 1404, and 1406 would not have achieved a density sufficient to be considered a final density. In embodiments where densification comprises a thermal gradient process having a heating source in thermal contact with a first surface of densified porous structure 1400 (such as in thermal contact with region 1402), the density of densified porous structure 1400 tends to be higher closer to the heating source. Thus, region 1402 tends to have a higher density than region 1404 and region 1404 tends to have a higher density than region 1406. Regions 1402, 1404, and 1406 may comprise individual porous structures, in various embodiments.

Although FIG. 14 illustrates discrete regions of densified porous structure 1400, in various embodiments, the discrete regions may comprise subregions having varying densities. Thus, for example, region 1406 may include several subregions having different densities. Certain techniques, such as a CT scan, may enable one to identify the densities of such subregions. Of course, using the Archimedes method, an average density of a region may be obtained, provided such region may be dissociated from the other regions.

As described above, in a conventional system, regions 1404 and 1406 may have been considered "waste" densification. However, using progressive densification, regions 1404 and 1406 may be harnessed for further densification and operable final parts may be derived from regions 1404 and 1406.

Figure 15:
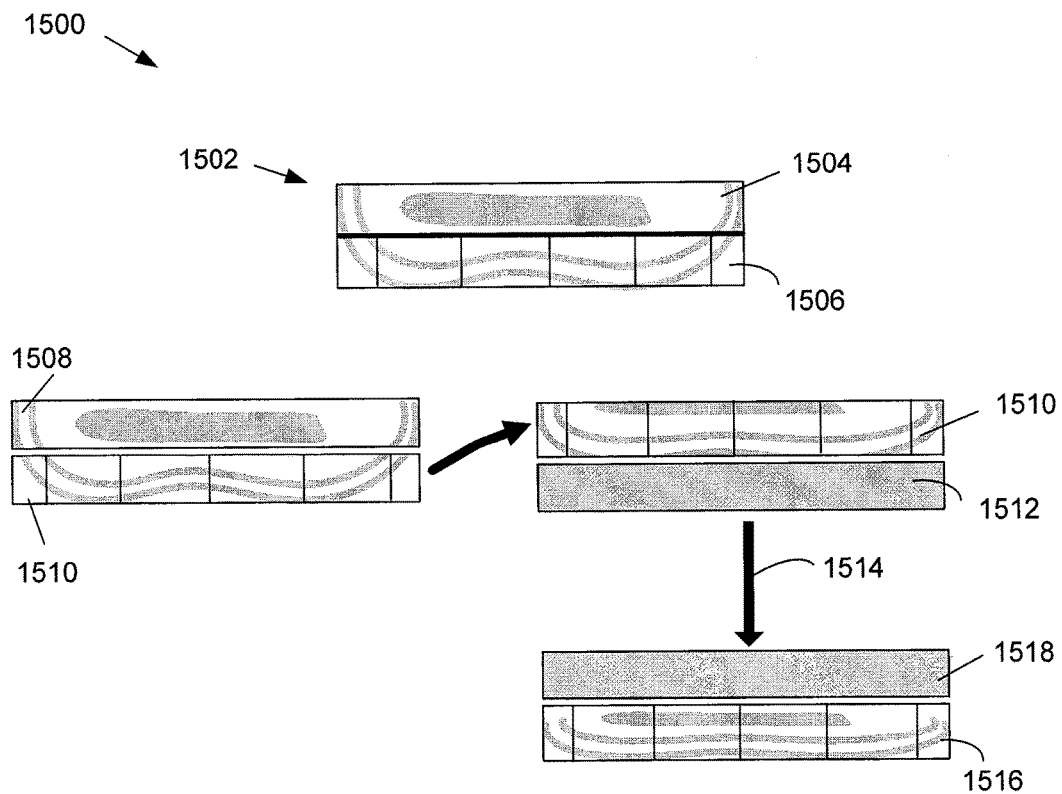
FIG. 15 illustrates an exemplary embodiment featuring densified porous structures in cross section.

With reference to FIG. 15, progressive densification process 1500 is shown. Porous structure system 1502 comprises first porous structure 1504 and second porous structure 1506 after a thermal gradient/pressure gradient densification cycle. The heating source during the thermal gradient/pressure gradient densification cycle was in thermal contact with first porous structure 1504. First porous structure 1504 and second porous structure 1506 have different densities such that first porous structure 1504 is denser than second porous structure 1506.

First porous structure 1504 and second porous structure 1506 may be separated to form separated first porous structure 1508 and separated second porous structure 1510. Separation may be accomplished using any known or hereinafter developed technique for separating a densified porous structure. For example, separation may be achieved through blunt force, machining, sawing, prying or the like. One or more surfaces of separated first porous structure 1508 and separated second porous structure 1510 may optionally be machined or smoothed.

Separated second porous structure 1510 may be coupled with undensified porous structure 1512 as shown in FIG. 15. For example, separated second porous structure 1510 and undensified porous structure 1512 may be coupled so that a surface of undensified porous structure 1512 is in contact with separated second porous structure 1510. The system of separated second porous structure 1510 and undensified porous structure 1512 may undergo thermal gradient/pressure gradient densification 1514 oriented so that separated second porous structure 1510 is in thermal contact with the heating source of thermal gradient/pressure gradient densification 1514.

At the end of thermal gradient/pressure gradient densification 1514, second porous structure 1510 has further densified, becoming finalized second porous structure 1518. Undensified porous structure 1512 has further densified, becoming partially densified structure 1516, wherein partially densified structure 1516 has a lower density than finalized second porous structure 1518. In such a manner, finalized second porous structure 1518 may be produced while simultaneously capturing the "waste" densification in partially densified structure 1516, which may undergo further densification to reach a final density.

Thus, a progressive densification process, coupled with a thermal gradient and/or pressure gradient densification process, may yield porous structures having a final density in as little as two densification cycles. In various embodiments, progressive densification processes as described herein may achieve a 10% to 20% decrease in net densification time relative to non-progressive configurations.

Figure 16:
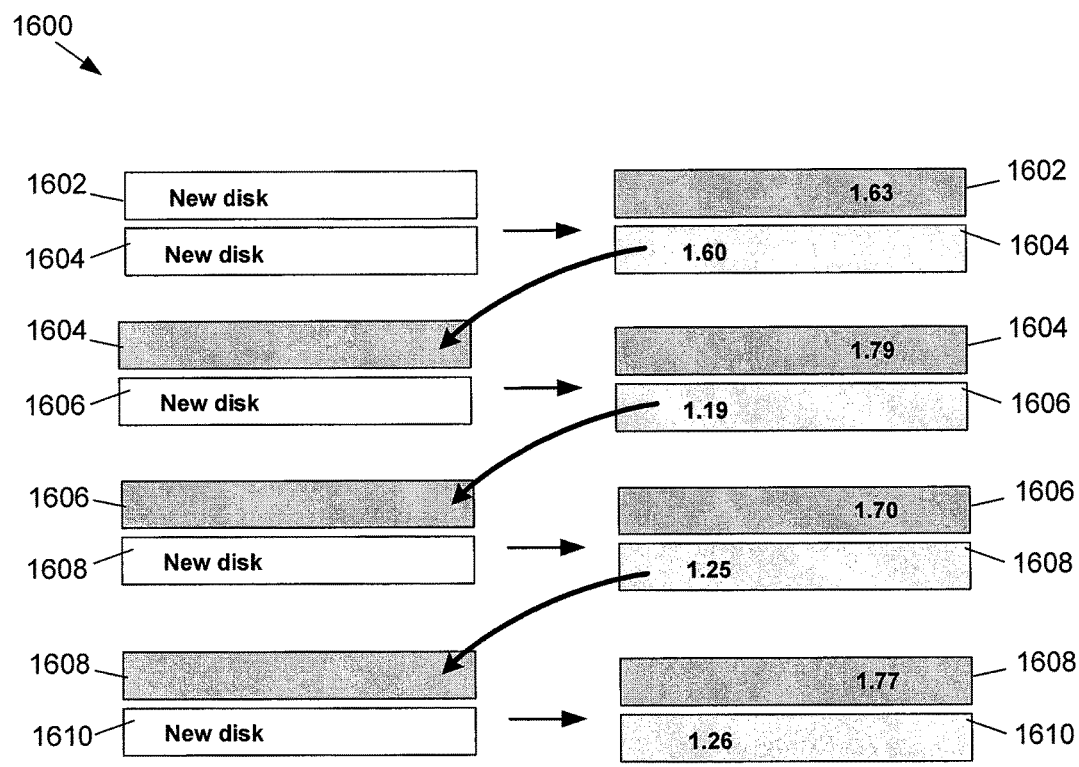
FIG. 16 illustrates an exemplary embodiment featuring densified porous structures in cross section.

With reference to FIG. 16, progressive densification process 1600 is shown in a C/C materials context. The densification processes of progressive densification process 1600 are thermal gradient/pressure gradient densification processes, though progressive densification may be used in conjunction with any densification process. Prior to densification, porous structure 1602 and porous structure 1604 are coupled so that porous structure 1602 is in thermal contact with the heating source of the thermal gradient densification process. In addition, porous structure 1602 and porous structure 1604 are coupled so that at least one surface of porous structure 1602 and at least one surface of porous structure 1604 are in contact.

After densification, porous structure 1602 and porous structure 1604 are partially densified. Although porous structure density after a densification cycle varies dependent upon various process parameters, FIG. 16 depicts exemplary densities for C/C composite porous structures after densification. Partially densified porous structure 1602, for example, has a density of 1.63 g/cm$^3$ and porous structure 1604 has a density of 1.60 g/cm$^3$. Prior to the next densification cycle, porous structure 1604 is coupled with undensified porous structure 1606. After densification, porous structure 1604 may reach a final density, such as about 1.79 g/cm$^3$ shown in FIG. 16. Porous structure 1606 may be partially densified, reaching, for example, a density of about 1.19 g/cm$^3$.

Porous structure 1606 may be coupled with undensified porous structure 1608 so that porous structure 1606 is in thermal contact with the heating source of the thermal gradient/pressure gradient densification process. In addition, porous structure 1606 and porous structure 1608 are coupled so that at least one surface of porous structure 1606 and at least one surface of porous structure 1608 are in contact. After densification, porous structure 1606 may reach a final density, such as 1.70 g/cm$^3$ while porous structure 1608 may reach a density below a final density, such as a density of 1.25 g/cm$^3$.

Partially densified porous structure 1608 may be coupled with undensified porous structure 1610 so that porous structure 1608 is in thermal contact with the heating source of the thermal gradient/pressure gradient densification process. In addition, porous structure 1608 and porous structure 1610 are coupled so that at least one surface of porous structure 1608 and at least one surface of porous structure 1610 are in contact. After densification, porous structure 1608 may reach a final density, such as 1.77 g/cm$^3$ while porous structure 1610 may reach a density below a final density, such as a density of 1.26 g/cm$^3$.

The process depicted in FIG. 16 may be conducted indefinitely, in other words, more than once. One may repeat the process of coupling a partially densified porous structure with an undensified porous structure such that there is contact between at least one surface of each porous structure and that the partially densified porous structure is positioned in thermal contact with a heating source in a thermal gradient densification/pressure gradient process. A thermal gradient/pressure gradient densification cycle may be performed to further densify the partially densified porous structure and partially densify the undensified porous structure. In various embodiments, the partially densified porous structure may reach a final density after the thermal gradient/pressure gradient densification cycle.

In various embodiments, progressive densification may be used with porous structure systems and/or with porous structures that may be divided during processing. For example, a first densification process may be performed using a thick porous structure. The thick porous structure may be split (e.g., cut or otherwise machined) so that the thick porous structure yields two porous structures. The denser of the two porous structures may be put aside while the other porous structure may be coupled with an undensified porous structure for a second densification process.

The use of thick porous structures that may be split or otherwise divided into less thick, medium, or thin porous structures may improve densification efficiency. For example, if a desired final porous structure thickness is 1 inch, a thick disk having a thickness of about 2 inches may be densified using progressive densification. Once a final density has been reached, the thick porous structure may be split into two porous structures having a thickness of about 1 inch, though some material would typically be lost due to the splitting process (e.g., saw kerf). In this manner, two porous structures of final density could be produced using reduced densification time.

In various embodiments, as mentioned above, porous structure systems may be used in place of porous structures in progressive densification processes. For example, one or more of the porous structures illustrated in FIG. 16 may comprise a porous structure system. In that regard, a porous structure system may be separated into constituent porous structures after or during progressive densification. For example, two thin porous structures may be stacked together (i.e., placed into surface to surface contact) to form a thick porous structure system which may undergo progressive densification.

In various embodiments, as mentioned above, porous structures of varying thickness may be used in progressive densification processes. For example, one or more of the porous structures illustrated in FIG. 16 may comprise a thin porous structure while others are of medium or thick thickness. In that regard, after the first densification cycle, the thin porous structure may be placed aside and the process continued with the other medium or thick porous structures.

Various thermal gradient and/or pressure gradient process may be used in conjunction with progressive densification. For example, the processes described above in FIGS. 10 and 12 may be used in progressive densification processes.

Figure 17:
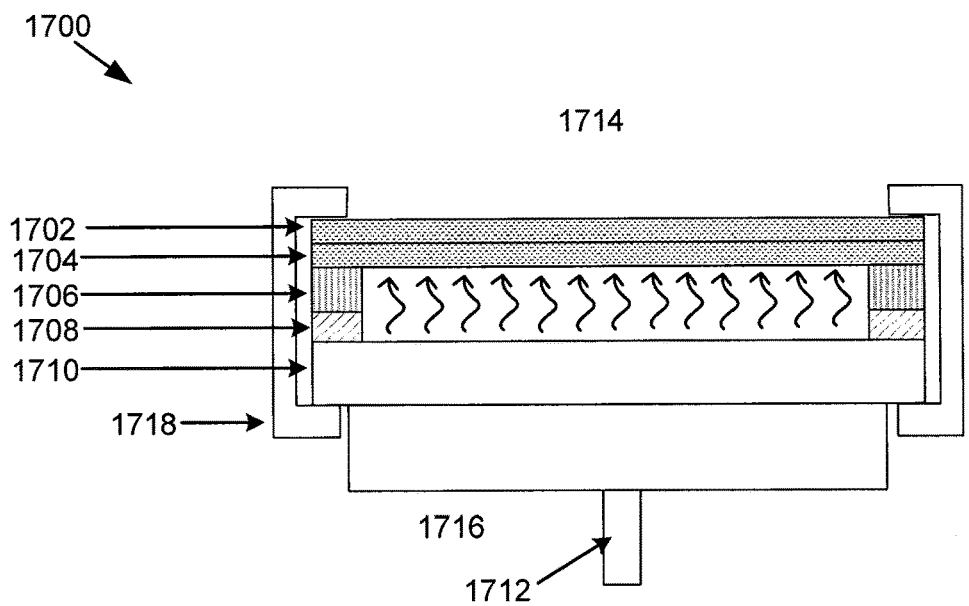
FIG. 17 illustrates an exemplary embodiment featuring densified porous structures in cross section.

With reference to FIG. 17, a cross section of apparatus 1700 that may be used during densification is illustrated in cross section. Apparatus 1700 may be used with a thermal gradient/pressure gradient densification process having a heating source 1714 and cold plate 1716. As described herein, inlet 1712 may serve the function of a gas outlet, depending upon the densification configuration. Undensified porous structures 1702 and 1704 are coupled such that at least one surface of each porous structure are in contact with one another. To secure undensified porous structures 1702 and 1704 in place, graphite clamp 1718 may be used, although such a clamp may be made of any material capable of withstanding the temperatures and pressures typical of a densification process. Graphite seal ring 1706 is shown in contact with undensified porous structure 1704. Graphite foil 1708 is shown in contact with graphite seal ring 1706, although in various embodiments graphite foil 1708 is not used. Graphite foil 1708 may comprise GRAFOIL® graphite foil available from GrafTech International Holdings Inc., 12900 Snow Road Parma, Ohio, USA, 44130. During densification, gas may be emitted from inlet 1712 and penetrate undensified porous structures 1702 and 1704.

Figure 18:
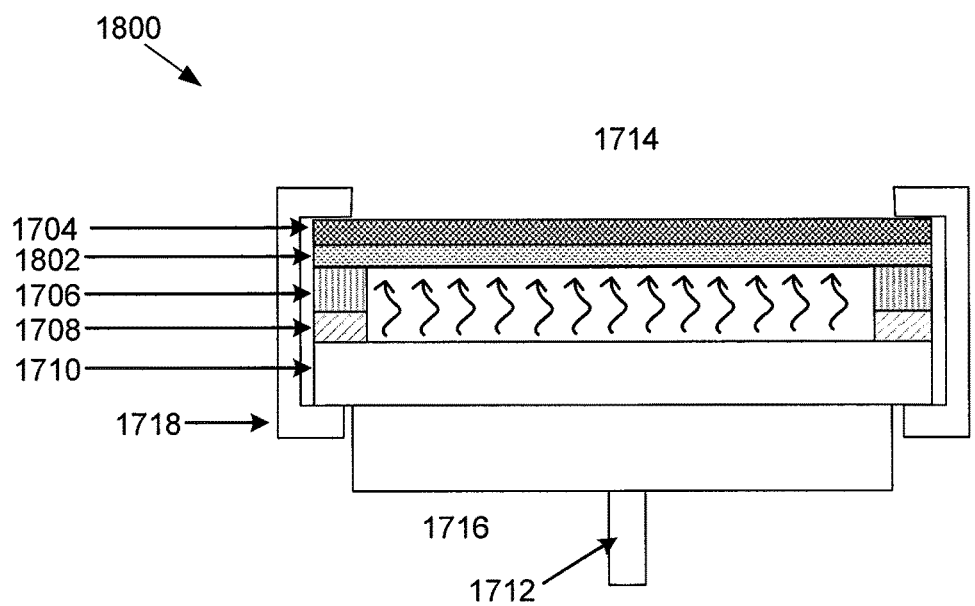
FIG. 18 illustrates an exemplary embodiment featuring densified porous structures in cross section.

With reference to FIG. 18, a cross section of apparatus 1800 that may be used during densification is illustrated in cross section, and may undergo a densification after the densification cycle illustrated in FIG. 17. Porous structure 1704, which may be partially densified during a densification cycle of apparatus 1700, is coupled with undensified porous structure 1802.

In various embodiments, as described above, progressive densification processes may include contact between a surface of one porous structure and a surface of another porous structure to form a porous structure system. Densification may occur within the porous structure system, and the porous structure system may be separated prior to start of an additional densification cycle.

However, in various embodiments, progressive densification processes may be characterized by the absence of contact between one or more porous structures. In such embodiments, porous structures may be separated so that there is a space or void between the one or more porous structures. The densification process in such embodiments may be impacted by the presence of such a space or void. The space or void acts as a break in the continuity of the medium to conduct gas flow, and thus thermal conduction and gas flow dynamics are affected relative to embodiments having contact between the one or more porous structures. Embodiments having a space or void may be useful where the porous structures are relatively rough such that surface to surface contact would be disrupted or disturbed by the roughness. In addition, embodiments having a space or void may be useful depending upon the selected densification process or if it is believed separation may pose a risk of damaging one or more porous structures.

In still further embodiments, progressive densification processes may include a component in between (i.e., at the interface of) a surface of one porous structure and a surface of another porous structure. Such component may be any material that would not substantially impede gas flow through the porous structures. For example, such a component may comprise graphite foil (e.g. GRAFOIL®) disposed between a surface of one porous structure and a surface of another porous structure during progressive densification. In such embodiments, the two porous structures may still be considered in contact with one another, even though such contact is through a component such as graphite foil.

Figure 19:
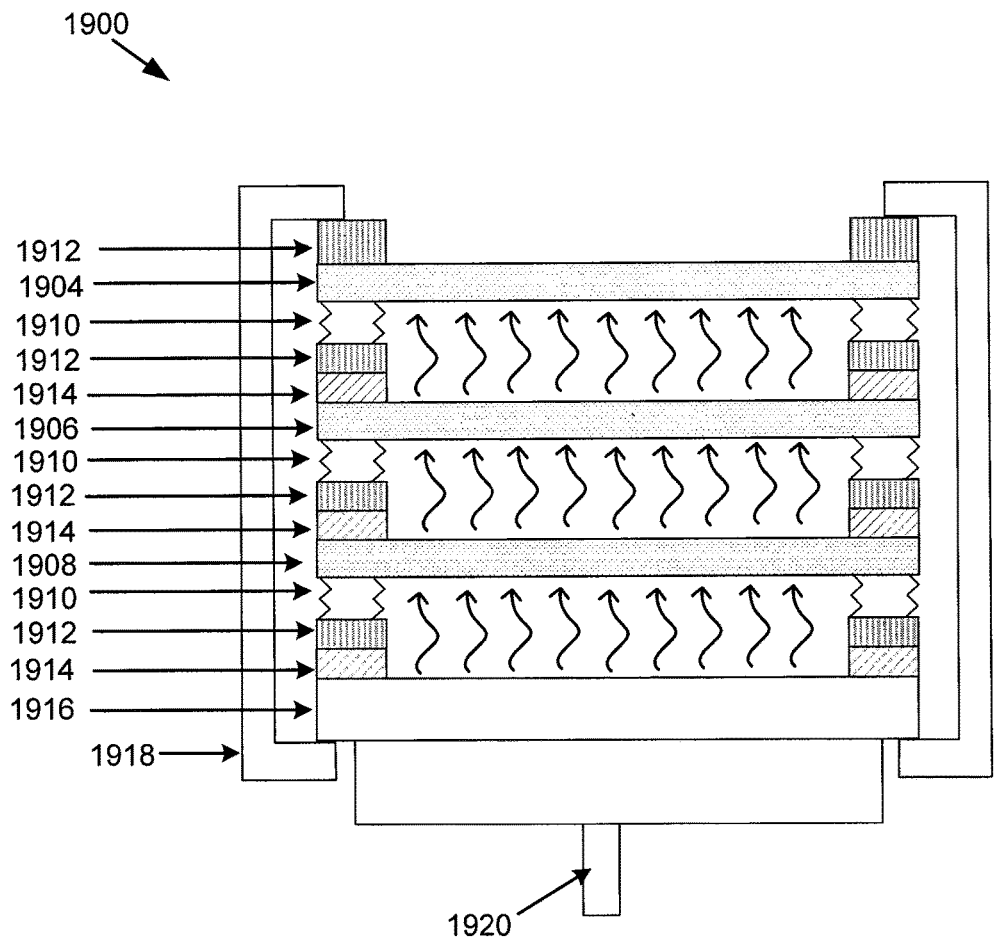
FIG. 19 illustrates a further exemplary embodiment.

With reference to FIG. 19, exemplary densification apparatus 1900 is shown. Undensified porous structures 1904, 1906, and 1908 are shown having a void or space between undensified porous structure 1904 and 1906 and undensified porous structure 1906 and 1908. Undensified porous structure 1904 is cemented to graphite seal ring 1912 by graphite cement 1910. Graphite foil 1914 is positioned between graphite seal ring 1912 and undensified porous structures 1906. Undensified porous structures 1906 and 1908 are similarly cemented to a graphite seal ring 1912 by graphite cement 1910. Graphite foil 1914 is positioned between graphite seal ring 1912 and adjacent undensified porous structure. The stack of undensified porous structures is clamped in place using graphite clamp 1918.

During densification, gas inlet 1920 may conduct gas into the void adjacent to undensified porous structure 1908. The gas may be conducted through all undensified porous structures 1904, 1906, and 1908. At the end of the densification cycle, depending on the densification process parameters, it is expected that porous structure 1904 would be denser than porous structure 1906, which would be denser than porous structure 1908.

Progressive densification may proceed by removing partially densified porous structure 1904 and positioning partially densified porous structure 1906 in the same position once occupied by porous structure 1904. Partially densified porous structure 1908 may be positioned where porous structure 1906 had occupied. A new, undensified porous structure (not shown) may be, positioned where porous structure 1908 previously occupied. An additional densification process may be performed and the position of the porous structures may be advanced in like manner. Depending on process parameters, the porous structures could achieve final density in one or more densification cycles.

TABLE 1 illustrates a progressive densification process. TABLE 1 illustrates several densification runs by disk thickness. Temperature in ° F. and pressure in torr are provided. As illustrated, a temperature and pressure gradient process is depicted. Density is given in g/cm$^3$. Density may be determined by CT scan or the Archimedes method. The densities reported below, as shown, represent densities of preforms from the top and bottom locations in the densification process.

TABLE 1

| Run | Control Temperature T(° F.) | Control P(torr) | In-disk Thermocouples (° F.) | | | Feed P (torr) | Density (g/cm$^3$) | |
| --- | --- | --- | --- | --- | --- | --- | --- | --- |
| | | | | | | | Top | Bottom |
| Thin disks | | | | Between disks | Bottom of bottom disk | | | |
| 1 | 2600 | 5 | | 1840-2100 | 1620-1960 | 44-85 | 1.62 | 1.60 |
| 2 | 2800 | 6 | | 2000-2100 | 1710-1860 | 60-78 | 1.79 | 1.19 |
| 3 | 2600 | 6 | | 1980-2040 | 1580-1820 | 53-68 | 1.70 | 1.25 |
| 4 | 2600 | 6 | | 1940-2000 | 1760-1900 | 58-76 | 1.77 | 1.26 |
| Medium Disks | | | Middle of top disk | Middle of bottom disk | Bottom of bottom disk | | | |
| 5 | 2575 | 5 | 2150-2200 | 1760-1960 | 1530-1810 | 60-59 | 1.28 | 1.27 |
| 6 | 2575 | 5 | 2100-2250 | 1800-1980 | 1570-1840 | 57-86 | 1.66 | 1.36 |
| 7 | 2575 | 5 | 2220-2300 | 1880-2050 | 1620-1920 | 58-74 | 1.62 | 1.54 |
| 8 | 2475 | 5 | 2160-2220 | 1800-1970 | 1630-1880 | 52-65 | 1.70 | 1.22 |
| 9 | 2475 | 5 | 2160-2220 | 1760-1980 | 1570-1870 | 50-67 | 1.61 | 1.35 |
| 10 | 2475 | 5 | — | 1900-1960 | 1710-1930 | 49-61 | 1.66 | 1.34 |
| 11 | 2375 | 5 | 2090-2200 | 1750-1910 | 1510-1740 | 49-62 | 1.69 | 1.12 |
| 12 | 2375, 2475 | 5 | 2120-2220 | 1690-1980 | 1460-1800 | 52-57 | 1.65 | 1.24 |
| 13 | 2375, 2475 | 5 | 2070-2170 | 1700-1980 | 1500-1850 | 47-52 | 1.67 | 1.24 |
| 14 | 2375, 2475 | 10.5 | 2110-2210 | 1700-1980 | 1480-1830 | 46-53 | 1.73 | 1.23 |
| 15 | 2376, 2475 | 10.5 | 2110-2210 | 1710-1080 | 1450-1610 | 52-61 | 1.69 | 1.31 |

TABLE 1-continued

| Run | Control Temperature T(° F.) | Control P(torr) | In-disk Thermocouples (° F.) | | | Feed P (torr) | Density (g/cm³) | |
|---|---|---|---|---|---|---|---|---|
| | | | | | | | Top | Bottom |
| Thick Disks | | | | | | | | |
| 16 | 2475 | 5 | 2130-2150 | 1710-1930 | 1490-1800 | 75-98 | 1.21 | 1.41 |
| 17 | 2475 | 5 | 2150-2270 | 1830-1960 | 1570-1820 | 61-76 | 1.60 | 1.46 |
| 18 | 2375, 2475 | 10.5 | 2100-2200 | 1720-1950 | 1530-1850 | 31-40 | 1.63 | 1.28 |

TABLE 2 illustrates a progressive densification process. TABLE 2 illustrates several densification runs by disk thickness. Thickness of the top and bottom disk, respectively, is given in inches. Before and after density (i.e., from bottom and top locations, respectively) is given in g/cm³. Density may be determined by CT scan or the Archimedes method.

TABLE 2

| | Bottom Disk | | | Top Disk | | |
|---|---|---|---|---|---|---|
| | Thick | Density (g/cm³) | | Thick | Density (g/cm³) | |
| Run Number | (in) | Before | After | (in) | Before | After |
| Thin thickness preforms | | | | | | |
| 1 | 0.91 | 0.39 | 1.19 | 0.92 | 1.60 | 1.79 |
| 2 | 0.87 | 0.39 | 1.25 | 0.91 | 1.19 | 1.70 |
| 3 | 0.85 | 0.41 | 1.26 | 0.87 | 1.25 | 1.77 |
| Medium thickness preforms | | | | | | |
| 1 | 1.47 | 0.39 | 1.34 | 1.53 | 1.35 | 1.66 |
| 2 | 1.48 | 0.39 | 1.12 | 1.47 | 1.34 | 1.69 |
| 3 | 1.48 | 0.39 | 1.24 | 1.48 | 1.24 | 1.68 |
| 4 | 1.48 | 0.38 | 1.23 | 1.48 | 1.24 | 1.71 |
| 5 | 1.45 | 0.39 | 1.31 | 1.48 | 1.23 | 1.70 |
| Thin thickness and medium thickness preforms | | | | | | |
| 1 | 1.27 | 0.39 | 1.37 | 1.08 | 1.26 | 1.77 |
| 2 | 1.07 | 0.39 | 1.32 | 1.27 | 1.37 | 1.78 |
| 3 | 1.28 | 0.38 | 1.39 | 1.07 | 1.32 | 1.75 |
| 4 | 0.92 | 0.41 | 1.39 | 1.50 | 1.36 | 1.78 |
| 5 | 1.48 | 0.39 | 1.47 | 0.92 | 1.39 | 1.76 |
| 6 | 1.11 | 0.40 | 1.46 | 1.48 | 1.47 | 1.77 |
| 7 | 1.69 | 0.40 | 1.30 | 1.11 | 1.46 | 1.75 |
| Thin thickness preforms | | | | | | |
| 1 | 0.93 | 0.48 | 1.39 | 0.86 | 1.56 | 1.79 |
| 2 | 0.93 | 0.49 | 1.30 | 0.93 | 1.39 | 1.72 |
| 3 | 0.96 | 0.50 | 1.44 | 0.93 | 1.30 | 1.78 |

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:
1. A process comprising:
coupling a first porous structure having a first surface and a second surface with a second porous structure having a first surface and a second surface, so that the second surface of the first porous structure is in direct contact with the first surface of the second porous structure, wherein the coupling comprises securing the first porous structure to the second porous structure with a first graphite clamp, wherein a portion of the second surface of the second porous structure is in contact with a graphite seal ring, the graphite seal ring disposed between the second surface of the second porous structure and a cooling element in thermal contact with the second surface of the second porous structure;
establishing a thermal gradient using a heating element in a process furnace, the temperature of the first surface of the first porous structure being higher than the temperature of the second surface of the second porous structure;
flowing gas through the second surface of the second porous structure, to form a solid residue within the first porous structure and the second porous structure;
decoupling the first porous structure and the second porous structure;
coupling the second porous structure with a third porous structure having a first surface and a second surface, so that the second surface of the second porous structure is in direct contact with the first surface of the third porous structure, and so that the second porous structure is coupled to the third porous structure, wherein the coupling comprises securing the second porous structure to the third porous structure with a second graphite clamp; and
flowing gas through the second surface of the third porous structure, while the second porous structure is coupled to the third porous structure, to form a solid residue within the second porous structure and the third porous structure.

2. The process of claim 1, wherein the porous structure comprises an annular structure.

3. The process of claim 1, wherein the porous structure comprises at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

4. The process of claim 1, wherein the porous structure comprises a carbonized preform.

5. The process of claim 1, wherein the gas comprises a hydrocarbon of 1 to about 8 carbon atoms.

6. The process of claim 1, wherein the gas comprises a precursor that thermally reacts to form at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

7. A process comprising:
coupling a first porous structure having a first surface and a second surface with a second porous structure having a first surface and a second surface, so that the second surface of the first porous structure is in direct contact with the first surface of the second porous structure, wherein the coupling comprises securing the first porous structure to the second porous structure with a first graphite clamp, wherein a portion of the second surface of the second porous structure is in contact with a graphite seal ring, the graphite seal ring disposed between the second surface of the second porous structure and a cooling element in thermal contact with the second surface of the second porous structure;
establishing a thermal gradient using a heating element in a process furnace, the temperature of the first surface of the first porous structure being higher than the temperature of the second surface of the second porous structure;
flowing gas through the first surface of the first porous structure, to form a solid residue within the first porous structure and the second porous structure;
decoupling the first porous structure and the second porous structure;
coupling the second porous structure with a third porous structure having a first surface and a second surface, so that the second surface of the second porous structure is in direct contact with the first surface of the third porous structure, and so that the second porous structure is coupled to the third porous structure, wherein the coupling comprises securing the second porous structure to the third porous structure with a second graphite clamp; and
flowing gas through the first surface of the second porous structure, while the second porous structure is coupled to the third porous structure, to form a solid residue within the second porous structure and the third porous structure.

8. The process of claim 7, wherein the porous structure comprises an annular structure.

9. The process of claim 7, wherein the porous structure comprises at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

10. The process of claim 7, wherein the porous structure comprises a carbonized preform.

11. The process of claim 7, wherein the gas comprises a hydrocarbon of 1 to about 8 carbon atoms.

12. The process of claim 7, wherein the gas comprises a precursor that thermally reacts to form at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

13. A process comprising:
establishing a thermal gradient using a heating element in a process furnace containing a porous structure having a first surface and a second surface, the temperature of the first surface of the porous structure being higher than the temperature of the second surface of the porous structure, wherein a portion of the second surface of the porous structure is in contact with a graphite seal ring, the graphite seal ring disposed between the second surface of the second porous structure and a cooling element in thermal contact with the second surface of the second porous structure;
flowing gas through the second surface of the porous structure to form a solid residue within the porous structure;
cutting the porous structure to form a first porous structure remnant and a second porous structure remnant, the first porous structure remnant having a thickness less than the porous structure;
coupling the second porous structure remnant with a second porous structure having a first surface and a second surface, so that the second surface of the second porous structure remnant is in direct contact with the first surface of the second porous structure, and so that the second porous structure remnant is coupled to the second porous structure, wherein the coupling comprises securing the second porous structure remnant to the second porous structure with a graphite clamp; and
flowing gas through the second surface of the second porous structure, while the second porous structure remnant is coupled to the second porous structure, forming a solid residue within the second porous structure remnant and the second porous structure.

14. The process of claim 13, wherein the porous structure comprises an annular structure.

15. The process of claim 13, wherein the porous structure comprises at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

16. The process of claim 13, wherein the porous structure comprises a carbonized preform.

17. The process of claim 13, wherein the gas comprises a hydrocarbon of 1 to about 8 carbon atoms.

18. The process of claim 13, wherein the gas comprises a precursor that thermally reacts to form at least one of carbon, silicon carbide, silicon nitride, boron carbide, aluminum nitride, titanium nitride, boron nitride, zirconia, $SiC_xN_y$ (wherein x is a number in the range from about zero to about 1, and y is a number in the range from about zero to about 4/3), silica, alumina, titania, and a combination of at least two of the foregoing.

19. A process comprising:
coupling a first porous structure system having a first surface and a second surface with a second porous structure system having a first surface and a second surface, so that the second surface of the first porous structure system is in substantial contact with the first surface of the second porous structure system, wherein the coupling comprises securing the first porous structure system to the second porous structure system with a first graphite clamp, wherein a portion of the second surface of the second porous structure system is in contact with a graphite seal ring, the graphite seal ring disposed between the second surface of the second porous structure and a cooling element in thermal contact with the second surface of the second porous structure;
establishing a thermal gradient using a heating element in a process furnace, the temperature of the first surface of the first porous structure system being higher than the temperature of the second surface of the second porous structure system;
flowing gas through the second surface of the second porous structure system, to form a solid residue within the first porous structure system and the second porous structure system;
separating at least one of the first porous structure system and the second porous structure system to yield a first porous subsystem;
coupling the first porous subsystem with a third porous structure system having a first surface and a second surface, so that the second surface of the first porous subsystem is in substantial contact with the first surface of the third porous structure system, and so that the first porous subsystem is coupled to the third porous structure system, wherein the coupling comprises securing the first porous subsystem to the third porous structure system with a second graphite clamp; and
flowing gas through the second surface of the third porous structure, while the first porous subsystem is coupled to the third porous structure system, to form a solid residue within the first porous subsystem and the third porous structure system.

20. The process of claim 19, wherein the second porous structure system comprises at least two porous structures.

* * * * *